(12) United States Patent
Hashimoto et al.

(10) Patent No.: US 7,029,960 B2
(45) Date of Patent: Apr. 18, 2006

(54) DEVICE MANUFACTURING METHOD

(75) Inventors: Takashi Hashimoto, Chino (JP);
Atsushi Takakuwa, Shiojiri (JP);
Tomoyuki Kamakura, Matsumoto (JP);
Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/756,416

(22) Filed: Jan. 14, 2004

(65) Prior Publication Data

US 2004/0195569 A1 Oct. 7, 2004

(30) Foreign Application Priority Data

Jan. 23, 2003 (JP) .............................. 2003-015097

(51) Int. Cl.
*H01L 21/00* (2006.01)
*H01L 21/84* (2006.01)
*H01L 21/30* (2006.01)

(52) U.S. Cl. ...................... 438/164; 438/158; 438/459

(58) Field of Classification Search .................. 438/30, 438/158, 157, 164, 160, 486, 459, 635, 949; 257/69, 72

See application file for complete search history.

(56) References Cited

U.S. PATENT DOCUMENTS 6,057,067 A 5/2000 Isberg et al.

FOREIGN PATENT DOCUMENTS

| JP | A 10-125929 | 5/1998 |
|---|---|---|
| JP | A 10-125930 | 5/1998 |
| JP | A 10-125931 | 5/1998 |
| JP | A 11-26733 | 1/1999 |
| JP | A 2000-133809 | 5/2000 |
| JP | A 2001-51296 | 2/2001 |
| JP | A 2001-125138 | 5/2001 |
| JP | A 2002-217390 | 8/2002 |
| JP | A 2002-217391 | 8/2002 |
| JP | A 2003-31778 | 1/2003 |
| JP | A 2003-142666 | 5/2003 |

OTHER PUBLICATIONS

Tatsuya Shimoda et al.; "Surface Free Technology by Laser Annealing (SUFTLA)"; IEDM; 1999; pp. 289-292.
Sumio Utsunomiya et al.; Low-Temperature poly-Si TFT transferred onto plastic substrates by using surface free (Continued)

*Primary Examiner*—Steven Loke
(74) *Attorney, Agent, or Firm*—Oliff & Berridge, PLC

(57) ABSTRACT

A device manufacturing method, including: a first process for providing the plural elements on the original substrate via a separation layer in a condition where terminal sections are exposed to a surface on an opposite side to the separation layer; a second process for adhering the surface where the terminal sections of the elements to be transferred on the original substrate are exposed, via conductive adhesive, to a surface of the final substrate on a side where conductive sections for conducting with the terminal sections of the elements are provided; a third process for producing exfoliation in the separation layer between the original substrate and the final substrate; and a fourth process for separating the original substrate from which the transfer of elements has been completed, from the final substrate.

11 Claims, 10 Drawing Sheets

OTHER PUBLICATIONS technology by laser ablation/annealing (SUFTLA); Journal of the SID; 2002; pp 69-73.

S. Utsunomiya et al.; Low Temperature Poly-Si TFT-LCD Transferred onto Plastic Substrate Using Surface Free Technology by Laser Ablation/Annealing (SUFTLA); Asia Display/IDW; 2001; pp 339-342.

Sumio Utsunomiya et al.; "4-3: Flexible TFT-LEPD Transferred onto Plastic Substrate Using Surface Free Technology by Laser Ablation/Annealing (SUFTLA)"; EURODISPLAY; 2002; pp 79-82.

Akihiko Asano et al.; "43.2: Low-Temperature Polycrystalline-Silicon TFT Color LCD Panel Made of Plastic Substrates"; SID 02 Digest; 2002; pp 1196-1199.

M. Kimura et al.; "An area-ratio gray-scale method to achieve image uniformity in TFT-LEPDs"; Journal of SID; 2000; pp 93-97.

T. Shimoda et al.; "Technology for Active Matrix Light Emitting Polymer Displays"; IEDM; 1999; pp 107-110.

Sumio Utsunomiya et al.; "21.3: Flexible Color AM-OLED Display Fabricated Usin g Surface Free Technology by Laser Ablation/Annelaing (SUFTLA) and Ink-jet Printing Technology" SID 03 Digest; 2003; pp 864-867.

DEVICE MANUFACTURING METHOD

BACKGROUND OF THE INVENTION

Priority is claimed on Japanese Patent Application No. 2003-15097, filed Jan. 23, 2003, the content of which is incorporated herein by reference.

1. Field of the Invention

The present invention relates to a manufacturing method for a device which manufactures a device by transferring elements, a device manufactured by the method, an electro-optic device, and electronic equipment.

2. Description of Related Art

Recently, for electro-optic devices such as liquid crystal electro-optic devices, active matrix type devices which use thin film elements such as thin film transistors (hereunder, TFT), thin film diodes (hereunder, TFD) or the like, have become the mainstream. However, regarding the conventional electro-optic devices furnished with amorphous silicon TFT or polycrystalline silicon TFT, manufacturing cost per unit area is expensive. Hence, in the case where large electro-optic devices are to be manufactured, a problem is that the cost becomes very expensive. One cause for this is the effective area utilization ratio of the transistor circuit on the substrate of the liquid crystal electro-optic device is low, and wastage of the thin film element constituent material which forms the film is considerable. That is to say, in the case where amorphous silicon TFT or polycrystalline silicon TFT are to be formed on the substrate by the conventional techniques, after film-forming the amorphous silicon on one side by CVD or the like, the unnecessary parts are removed by etching. However, the TFT circuit area inside the pixel area is only from a few % to several 10% and the thin film element constituent material which is film-formed on the rest of pixel electrode part is discarded by etching. In cases where it is possible to effectively manufacture only the TFT circuit section on the substrate, it is possible to greatly reduce the cost, especially of large electro-optic devices. Therefore various techniques have been studied.

Conventionally, as a technique for arranging an LSI circuit which is manufactured on a silicon wafer, onto another substrate, a so called microstructure method developed by Alien Technology Co. is well known (for example, refer to the Information DISPLAY, Vol. 15, No. 11 (November 1999)).

The microstructure technique is characterized in that it involves separating LSI circuits manufactured on a silicon wafer into microchips (=microstructures), and then pouring solvent dispersed with the microstructures onto a substrate previously patterned with holes for filling, so that the microstructures are arranged at predetermined positions on the substrate. According to this microstructure technique, microstructures which are formed in a large number on a silicon wafer can be dispersingly arranged on a substrate. Moreover, since this gives a discrete type arrangement where unit elements are separated on the substrate, the ability to follow the curvature and bending of the substrate is excellent, so that it is applicable to flexible substrates.

However, in the microstructure technique, there is the problem in that reliable arrangement of the microstructures on the substrate and accurate positioning are difficult. Moreover, since the directions in which the microstructures are arranged are random, special circuits to cope with this must be provided for the microstructures, with the problem of incurring a cost increase. In the present state, this problem is avoided by designing the circuits on microstructures in four-way symmetry.

Further, in the manufacture of color filters of liquid crystal displays, a method called an LITI process is well known, in which; a donor sheet formed by the sequential lamination of respective layers of; substrate/adhesion layer/optical absorption layer/protective layer/colored film layer/thermal melting adhesion layer, is superposed on an original substrate; the optical absorption layer is then photoirradiated for a partial area of the donor sheet; heat generated here melts and adheres the thermal melting adhesion layer; and as a result only the photoirradiated area is transferred onto the substrate (for example, refer to the U.S. Pat. No. 6,057,067).

However, this conventional technique is used for manufacturing color filters or the like for liquid crystal display elements, and other application possibilities have not been specified.

Furthermore, as a method for transferring a thin film element such as a TFT or the like formed on a substrate, to a transfer body, the present applicant has developed and applied to patent, a transferring method for a thin film element, which is characterized in having; a process for forming a separation layer on a substrate of high reliability and which can transmit laser light; a process for forming a transfer layer containing a thin film element on the separation layer; a process for adhering the transfer layer containing the thin film element to the transfer body via an adhesion layer; a process for photoirradiating the separation layer and generating exfoliation in the layer and/or on interface of the separation layer; and a process for separating the substrate from the separation layer (refer to the Japanese Pat. Application No. Hei 10-125931).

Likewise, the present applicant has developed and applied to patent a method for transferring a thin film element, which is characterized in having: a first process for forming a first separation layer on a substrate; a second process for forming a transfer layer containing a thin film device on the first separation layer; a third process for forming a second separation layer on the transfer layer; a fourth process for adhering a primary transfer body on the second separation layer, a fifth process for removing the substrate from the transfer layer with the first separation layer made a border, a sixth process for adhering a secondary transfer body on the undersurface of the transfer layer, and a seventh process for removing the primary transfer body from the transfer layer with the second separation layer made a border; and the transfer layer containing the thin film device is transferred to the secondary transfer body (refer to the Japanese Patent Application No. Hei 11-26733).

According to these transferring techniques, it is possible to transfer a detailed and high performance functional device onto a desired substrate.

However, the conventional transfer techniques have the following problems.

That is to say, since the conventional transfer techniques are to transfer all of the thin film elements such as TFTs which are formed on the substrate onto the final substrate, then as with an active matrix substrate for electro-optic devices, a large number of TFTs are required. However, in order to manufacture a substrate for which the arranged area of the TFTs is small with respect to the whole substrate area, it is necessary to specially manufacture a substrate where a large number of TFTs are formed at the same intervals as for the final substrate, and transfer these to the final substrate, or it is necessary to repeat the transfer many times, which does not always give a reduction in cost.

Further, since the conventional transfer techniques are to transfer all the thin film elements such as TFTs which are formed on the substrate onto the final substrate, then the larger the area of the substrate, the higher the characteristic required for the irradiating laser light, that is, the higher the power and uniformity, so that it becomes difficult to obtain a laser light source which satisfies the required performance, and large sized highly accurate irradiation equipment becomes necessary for the laser light irradiation. In addition, when irradiating a high power laser light, the thin film elements may be heated above their heat resistant critical temperature, so that the function of the thin film element itself may be lost. Hence, there is the problem that the transfer process itself becomes difficult.

Furthermore, similarly to the conventional transfer techniques, in the case where the thin film elements formed on the substrate are transferred for each device, for example, an insulating film is continuously formed over the whole surface of the thin film element. Therefore cracking may occur when the final substrate is bent after the transfer, and the ability to follow the bending of the substrate is not good. As a result, in the conventional transfer techniques, the degree of freedom for selecting the final substrate is limited.

SUMMARY OF THE INVENTION

The present invention takes into consideration the above situation with the object of providing, a manufacturing method for a device which enables the manufacture of a device effectively at low cost, by dispersingly arranging elements such as TFTs on a final substrate which becomes an active matrix substrate for an electro-optic device, and a device which can be manufactured effectively at low price, and an electro-optic device and electronic equipment equipped with such a device.

In order to achieve the above object, a manufacturing method for a device of the present invention, in which some or all of plural elements formed on an original substrate are transferred to a final substrate, and some or all of the transferred elements are used to manufacture the device, including: a first process for providing the plural elements on the original substrate via a separation layer in a condition where terminal sections are exposed to a surface on an opposite side to the separation layer; a second process for adhering the surface where the terminal sections of the elements to be transferred on the original substrate are exposed, via conductive adhesive, to a surface of the final substrate on a side where conductive sections for conducting with the terminal sections of the elements are provided; a third process for producing exfoliation in the separation layer between the original substrate and the final substrate; and a fourth process for separating the original substrate from which the transfer of elements has been completed, from the final substrate.

According to the manufacturing method for a device of the present invention, it is possible to concentratedly manufacture, for example on the original substrate, the many elements which are to be dispersingly arranged at intervals on the final substrate. Hence, compared to the case where elements are directly formed on the final substrate, it is possible to greatly increase the area efficiency of the substrate when manufacturing elements. Consequently, it becomes possible to manufacture effectively and at low cost, a final substrate where many elements are dispersingly arranged. As a result, the device itself can be effectively manufactured at low cost.

Moreover, it possible to easily execute prior to transfer, selection and removal of bad quality elements from the many elements which are concentratedly arranged on the original substrate. As a result, product yield rate can be increased.

Since the surface where the terminal sections of the elements are exposed is adhered via the conductive adhesive to the final substrate, then for example, by directly adhering the conductive adhesive to the conductive sections on the final substrate, adhesion of the elements to the final substrate and conducting the terminal sections with the conductive sections can be performed at the same time. Hence, the process for terminal sections of the element are exposed, or to the position to be connected to the terminal sections on the surface of the final substrate on the side where the conductive sections are provided.

In this manner, since this is film-like adhesive, it becomes easy to handle the conductive adhesive, and hence productivity can be increased.

In the manufacturing method, preferably in the second process, the conductive adhesive is provided between the elements and the final substrate in liquid form, and then cured.

In this manner, the degree of freedom in selecting the application method; such as for example overall coating by spin coating, selective coating by a liquid droplet discharge method, or various printing methods, is higher, so that it becomes possible to select the suitable application method corresponding to the type of element.

In the case where the conductive adhesive is liquid form, preferably the conductive adhesive is selectively arranged by a liquid droplet discharge method.

In this manner, since the conductive adhesive can be arranged at only the desired position, then for example, by arranging the conductive adhesive only at the places corresponding to the elements to be transferred, loss of the adhesive can be reduced. Moreover, transfer of the elements to the final substrate can be done easily.

Preferably in the case where the conductive adhesive is selectively arranged by the liquid droplet discharge method, prior to this, the position where the conductive adhesive for the elements or for the final substrate is arranged is subjected to a lyophilic treatment, and/or the surroundings of the position where the conductive adhesive is arranged is subjected to a liquid repellent treatment.

In this way, even in the case where the droplets are discharged, shifted from the desired position, due to the liquid repellent treatment, the droplets are repelled to the conducting the terminal sections with the conductive sections by wiring after transferring becomes unnecessary.

Furthermore, it is possible to laminate and unite the same or different elements. Therefore, by uniting the elements manufactured under different process conditions, an element having a laminated structure which is conventionally difficult to manufacture can be provided, and an element having a three-dimensional structure can be easily manufactured.

Furthermore, in the manufacturing method, preferably the original substrate is a substrate for forming elements.

In this manner, when forming elements on the original substrate, the terminal sections thereof may be arranged on the opposite side to the original substrate, that is, the outer side. Hence, it becomes easy to form the terminal sections.

In the manufacturing method, preferably the conductive adhesive is an anisotropic conductive adhesive.

In this manner, for example, in the case where there are plural terminal sections of the elements, and the conductive sections are respectively conducted to these terminal sections, the terminal sections and the corresponding conductive sections are arranged to oppose each other, and are adhered by the anisotropic conductive adhesive, and pressed, so that the anisotropic conductive adhesive can demonstrate the anisotropy thereof and conduct only between the opposing terminal sections and conductive sections. Hence, it is not necessary to form the conductive adhesive in a condition of independence for each of the respective terminal sections. As a result, productivity is extremely good.

In the case where the conductive adhesive is an anisotropic conductive adhesive, then preferably in the second process, film-like adhesive is used as the conductive adhesive, and this film-like adhesive is formed on the surface on the side where the desired position, and as a result are applied to the desired position. Furthermore, the droplets discharged to the desired position, due to the lyophilic treatment, stay in that position and do not flow to the surroundings.

Preferably in the case where the conductive adhesive is selectively arranged by the liquid droplet discharge method, prior to this, a partition is formed to enclose the position where the conductive adhesive for the elements or for the final substrate is arranged, and then, the conductive adhesive is selectively arranged within the partition.

In this manner, by arranging the conductive adhesive by discharging within the partition, the conductive adhesive can be more reliably applied to the desired position.

In the case where the conductive adhesive is selectively arranged by the liquid droplet discharge method, prior to this, it is preferable to form a concavity at a junction position of the elements with the final substrate, and then to selectively arrange the conductive adhesive in the concavity.

In this manner, by arranging the conductive adhesive by discharging into the concavity, the conductive adhesive can be more reliably applied to the desired position. Furthermore, for example, in the case where the concavity is formed in a shape to fit the element, then by fitting the element to the concavity, positioning is possible when adhering the original substrate and the final substrate. Hence, positioning when adhering the substrates can be easily and accurately performed. Furthermore, by fitting the element into the concavity, it is possible to thin the substrate where the elements are mounted (the final substrate).

In the case where a concavity is formed at the junction position of the element with the final substrate, and the conductive adhesive is then selectively arranged in the concavity, it is preferable to provide beforehand in the concavity, conductive sections for conducting with the terminal sections of the elements.

In this manner, adhering the elements to the final substrate, and conducting the terminal sections with the conductive sections can be performed at the same time. Hence, the process after transferring, for conducting the terminal sections with the conductive sections by wiring becomes unnecessary.

In the manufacturing method, in a case where there are plural terminal sections of the elements, it is preferable to form the conductive adhesive to be formed on these terminal sections in a condition of independence for each of the respective terminal sections, and to insulate between the independent conductive adhesives.

In this manner, even if the conductive adhesive is not an anisotropic conductive adhesive but a general one, short-circuits between the terminal sections by the conductive adhesive can be prevented.

The device of the present invention is characterized in that, in a device including elements provided on a substrate, terminal sections are provided in an exposed condition on a surface of the elements on the substrate side, and conductive sections for conducting with the terminal sections of the elements are provided on the surface of the substrate on the side where the elements are provided; and the elements are adhered to the substrate by a conductive adhesive which conducts between the terminal sections and the conductive sections.

According to this device, since the surface where the terminal sections of the elements are exposed, is adhered via the conductive adhesive to the conductive sections on the substrate, then at the time of manufacture, a process for mounting the elements on the substrate and a process for conducting the terminal sections of elements with the conductive sections of the substrate are performed at the same time. Therefore, a process after mounting for conducting the terminal sections with the conductive sections by wiring becomes unnecessary, giving high productivity.

In the device, preferably the conductive adhesive is an anisotropic conductive adhesive.

In this manner, for example, in the case where there are plural terminal sections of the elements, and the conductive sections are respectively conducted with these terminal sections, the terminal sections and the corresponding conductive sections are arranged to oppose each other, and are adhered by the anisotropic conductive adhesive, and pressed, so that the anisotropic conductive adhesive can demonstrate the anisotropy thereof and conduct only between the opposing terminal sections and conductive sections. Hence, it is not necessary to form the conductive adhesive in a condition of independence for each of the respective terminal sections. As a result, productivity is extremely good.

Moreover, preferably in the device there are plural terminal sections of the elements, and the conductive adhesives to be formed on these terminal sections are formed in a condition of independence for each of the respective terminal sections, and between the independent conductive adhesives is insulated.

In this manner, even if the conductive adhesive is not an anisotropic conductive adhesive but a general one, short-circuits between the terminal sections by the conductive adhesive can be prevented.

In the case where the conductive adhesive to be formed on the terminal sections is formed in a condition of independence for each of the respective terminal sections, and between the independent conductive adhesives is insulated, it is preferable that the conductive adhesives are in the independent condition by arranging these conductive adhesives separated for each of the respective terminal sections, and between the conductive adhesives is insulated.

In this manner, short-circuits between the terminal sections by the conductive adhesive can be reliably prevented.

Moreover, in the case where the conductive adhesive to be adhered to the terminal sections is formed in a condition of independence for each of the respective terminal sections, and between the independent conductive adhesives is insulated, it is preferable that the conductive adhesives are in the independent condition for each of the respective terminal sections by separating by an insulative partition, and between the conductive adhesives is insulated.

In this manner, short-circuits between the terminal sections by the conductive adhesive can be reliably prevented.

Furthermore, in the case where the conductive adhesive to be adhered to the terminal sections is formed in a condition of independence for each of the respective terminal sections, and between the independent conductive adhesive is insulated, it is preferable that the conductive adhesives are in the independent condition for each of the respective terminal sections by arranging into respectively independent concavities, and between the conductive adhesives is insulated.

In this manner, short-circuits between the terminal sections by the conductive adhesive can be reliably prevented.

Moreover, the device of the present invention is characterized in being obtained by the manufacturing methods according to any one of the above aspects.

According to this device, it is manufactured effectively at low cost, and product yield rate is also increased.

The electro-optic device of the present invention is characterized in being equipped with the aforementioned device.

According to this electro-optic device, the device is manufactured effectively at low cost and product yield rate is also increased, so that the electro-optic device itself is also manufactured at low cost.

The electronic equipment of the present invention is characterized in being equipped with the aforementioned device.

According to this electronic equipment, the device is manufactured effectively at low cost and product yield rate is also increased, so that the electronic equipment itself is also manufactured at low cost.

As described above, according to the manufacturing method for a device of the present invention, plural elements which are to be dispersingly arranged at intervals on the final substrate are concentratedly manufactured on the original substrate. Therefore, devices can be manufactured effectively at low cost.

Moreover, the plural elements which are concentratedly manufactured on the original substrate can be easily selected and removed before the transfer. As a result, product yield rate can be increased.

Furthermore, since the surface where the terminal sections of the elements are exposed is adhered via the conductive adhesive to the final substrate, then for example, by directly adhering the conductive adhesive to the conductive sections on the final substrate, adhesion of the elements to the final substrate and conducting the terminal sections with the conductive sections can be performed at the same time. Hence, the process for conducting the terminal sections with the conductive sections by wiring after transferring is obviated, enabling simplification of the processes and an increase in productivity.

Moreover, an element having a laminated structure which is conventionally difficult to manufacture can be provided, and an element having a three-dimensional structure can be easily manufactured.

BRIEF DESCRIPTION OF THE DRAWINGS

FIG. 2A is a side cross-section showing a condition where many elements are formed on the separation layer, FIG. 2B is an enlarged side cross-section of a main part for describing another example of formation, and FIG. 2C is an enlarged side cross-section for showing a device.

FIG. 12A is a perspective view of the main parts and FIG. 12B is a side cross-section of the main parts.

FIG. 19A shows an example of a mobile phone, FIG. 19B shows an example of a portable information processor, and FIG. 19C shows an example of a watch type electronic equipment.

DETAILED DESCRIPTION OF THE INVENTION

Hereunder is a description of embodiments of the present invention, with reference to the drawings.

(First Embodiment)

FIG. 1 to FIG. 7 are explanatory drawings of a first embodiment of the present invention (element transfer method). This element transfer method is an example of where an anisotropic conductive adhesive film is specifically used as a conductive adhesive, and is executed through the following first process to fourth process.

[First Process]

Figure 1:
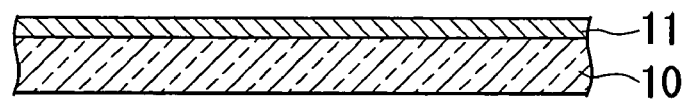
FIG. 1 is an explanatory diagram of a first embodiment of a device of the present invention, and a side cross-section showing a first process for forming a separation layer on an original substrate.
Figure 2A:
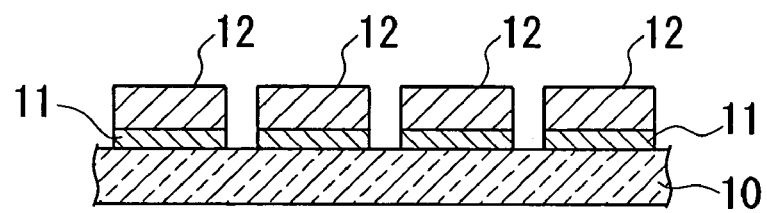
FIG. 2A to 2C are explanatory diagrams of a second process for forming many elements on a separation layer.

In the first process, as shown in FIG. 1, a separation layer 11 is formed on an original substrate 10, and furthermore, as shown in FIG. 2A, many elements 12 are formed on the separation layer 11.

The original substrate 10 in the present embodiment, is a substrate for element forming. Such an element forming substrate is preferably one having transmittance that allows transmission of light.

In this case, the transmissivity of light is preferably more than 10%, and more preferably more than 50%. If the transmissivity is too low, the loss of light becomes large, and a larger quantity of light is required in order to exfoliate the separation layer 11.

Moreover, preferably the original substrate 10 is constructed from highly reliable material, specifically, it is preferably constructed from materials with superior heat resistance. The reason is that for example, when forming an element 12 or intermediate layer 16 described later, the process temperature may become high depending on the type or formation method (for example, around 350 to 1000° C.). However, even in such a case, if the substrate 10 is superior in heat resistance, then when forming the element 12 on the original substrate 10, the range of settings for the film forming conditions such as the temperature conditions and the like, can be wider.

Therefore, if the maximum temperature when forming the element 12 is Tmax, the original substrate 10 is preferably manufactured from a material with a distortion point greater than Tmax. Specifically, the constituent material for the original substrate 10, preferably has a distortion point greater than 350° C., and more preferably has a distortion point greater than 500° C. As such materials, heat resistant glass such as quartz glass, Corning 7059, and OA-2 made by Nippon Electric Glass Co. are given as examples.

The thickness of the original substrate 10 is not specifically limited. However it is preferably around 0.1 to 5.0 mm, and more preferably around 0.5 to 1.5 mm. If the thickness of the original substrate 10 is too thin, the strength drops, while if too thick, then in the case where the transmissivity of the original substrate 10 is low, attenuation of light can easily occur. In the case where the transmissivity of the original substrate 10 is high, the thickness may be greater than the aforementioned upper limit. In order to evenly irradiate the light, the thickness of the original substrate 10 is preferably uniform.

The separation layer 11 is formed by materials which easily produce exfoliation by the action of mechanical force. That is to say, it is formed by such materials that; when a force acting on the separation layer 11 in a direction to separate the original substrate 10 and a later described final substrate, is applied from one edge of those substrates, it easily produces exfoliation in the layer and/or on the interface of the separation layer 11 (hereunder, "internal exfoliation" and "interfacial exfoliation").

Furthermore, such a separation layer 11 preferably has a characteristic of absorbing irradiated light and producing exfoliation in the layer and/or on the interface, that is to say, internal exfoliation and/or interfacial exfoliation. Specifically, it is desired that the interatomic or intermolecular binding strength of the constituent material of the separation layer 11 is eliminated or reduced by light irradiation, that is, ablation is produced ending in internal exfoliation and/or interfacial exfoliation.

Furthermore, in some cases gas will be released from the separation layer 11 by the light irradiation, to manifest the separation effect. That is to say, there is the case where an element contained in the separation layer 11 becomes a gas and is released, and the case where the separation layer absorbs the light and instantly becomes a gas and the vapor thereof is released to contribute to the separation.

Examples of the constituent materials for the separation layer 11, are those described in A–F hereunder.

A. Amorphous silicon (a-Si)

This amorphous silicon may contain hydrogen (H). In this case, it is preferable that the H content be approximately 2 atomic percent or more, and more preferably 2 to 20 atomic percent. When a predetermined amount of hydrogen (H) is contained in this manner, hydrogen is released by light irradiation and an internal pressure is generated in the separation layer 11, becoming a force to separate the upper and lower thin films. The hydrogen (H) content in the amorphous silicon can be controlled by appropriately setting the film forming conditions, for example, the gas composition, gas pressure, gas atmosphere, gas flow rates, temperature, substrate temperature and input power in the CVD.

B. Oxide ceramics, dielectrics (ferroelectrics) and semiconductors, such as silicon oxides and silicates, titanium oxides and titanates, zirconium oxide and zirconates, and lanthanum oxide and lanthanates. Examples of silicon oxides include SiO, $SiO_2$, and $Si_3O_2$, and examples of silicates include $K_2SiO_3$, $Li_2SiO_3$, $CaSiO_3$, $ZrSiO_4$, and $Na_2SiO_3$.

Examples of titanium oxides include TiO, $Ti_2O_3$, and $TiO_2$, and examples of titanates include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$ and $FeTiO_3$.

Examples of zirconium oxides include $ZrO_2$, and examples of zirconates include $BaZrO_2$, $ZrSiO_4$, $PbZrO_3$, $MgZrO_3$ and $K_2ZrO_3$.

C. Ceramics and dielectrics (ferroelectrics), such as PZT, PLZT, PLLZT, PBZT.

D. Nitride ceramics, such as silicon nitride, aluminum nitride, titanium nitride.

E. Organic Polymers:

Usable organic polymers have linkages (which are cut by irradiation of the light), such as —CH—, —CO— (ketone), —CONH— (amide), —NH— (imide), —COO— (ester), —N=N— (azo), —CH=N— (cis). In particular, any organic polymers having large numbers of such linkages can be used. The organic polymers may have aromatic hydrocarbons (one or more benzene rings or fused rings) in the chemical formulae.

Examples of the organic polymers include polyolefins, such as polyethylene, and polypropylene; polyimides; polyamides; polyesters; polymethyl methacrylate (PMMA); polyphenylene sulfide (PPS); polyether sulfone (PES); and epoxy resins.

F. Metals

Examples of metals include Al, Li, Ti, Mn, In, Sn, Y, La, Ce, Nd, Pr, Gd, Sm, and alloys containing at least one of these metals.

The thickness of the separation layer 11 depends on various conditions, such as the purpose for exfoliation, the composition of the separation layer 11, the layer configuration, and the method for forming the layer. However, normally a thickness of around 1 nm to 20 μm is preferable, more preferably around 10 nm to 2 μm, and even more preferably around 40 nm to 1 μm. If the film thickness of the separation layer 11 is too small, uniformity in deposition may be lost, and nonuniformity may occur in the separation. If the film thickness is too thick, then in order to maintain good peelability of the separation layer 11, it is necessary to increase the power of light (quantity of light), and when removing the separation layer 11 later, the operation takes time. It is preferable that the thickness of the separation layer 2 be as uniform as possible.

The method for forming the separation layer 11 is not limited, and is determined depending on several conditions, such as the film composition and thickness. Examples of the methods include vapor phase deposition processes, such as CVD (including MOCVD, low pressure CVD, ECR-CVD), evaporation, molecular beam (MB) evaporation, sputtering, ion-plating, and PVD; plating processes, such as electro-plating, dip-plating (dipping), and electroless-plating; coating process, such as a Langmuir-Blodgett process, spin-coating process, spray-coating process, and roll-coating process; printing processes; transfer processes; ink-jet processes; and powder-jet processes. A combination of these processes may also be used.

For example, when the separation layer 11 is composed of amorphous silicon (a-Si), it is preferable that the layer be formed by a CVD process, specifically a low pressure CVD or plasma CVD process.

When the separation layer 11 is formed from a ceramic by a sol-gel process, or formed from an organic polymer, it is preferable that the layer be formed by a coating process, and particularly a spin-coating process. Further, although not shown in FIG. 1, depending on the properties of the original substrate 10 and the separation layer 11, an intermediate layer may be arranged between the original substrate 10 and the separation layer 11 with an object of increasing the adhesion of both.

If the separation layer 11 is formed in this way, then as shown in FIG. 2A, many elements 12 are formed on the separation layer 11, and then an etching process is performed so that the respective elements 12 and the separation layer 11 immediately beneath remain as islands style. The result is such that, as shown in FIG. 2A, the many transferred layers (elements 12) are arranged at predetermined intervals via the separation layer 11 on the original substrate 10. In this manner, by forming the elements 12 being the transferred layers, and the separation layer 11 as islands, it becomes easy to transfer only the desired elements 12 in an exfoliation process described later.

Figure 2B:
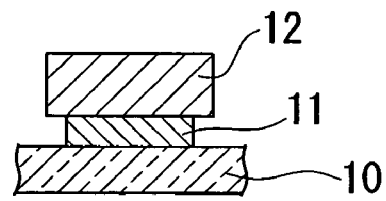

The separation layer 11 divided for each of the respective elements 12, as shown in FIG. 2A, may be the same size as the separation layer adhesion face of the element 12. However, it may be such that, as shown in FIG. 2B, the separation layer 11 is further over-etched so that the adhesion area of the separation layer 11 to the element 12 becomes smaller than the whole area of the separation layer adhesion face of element 12. In this manner, by over-etching the separation layer 11, then when the mechanical force is exerted on the separation layer 11, exfoliation is easily produced at the separation layer 11. Furthermore as described later, when irradiating light as a pre-exfoliation process, exfoliation is easily produced. Moreover, by reducing the separation layer 11, the amount of light energy required for exfoliation can be reduced.

Figure 2C:
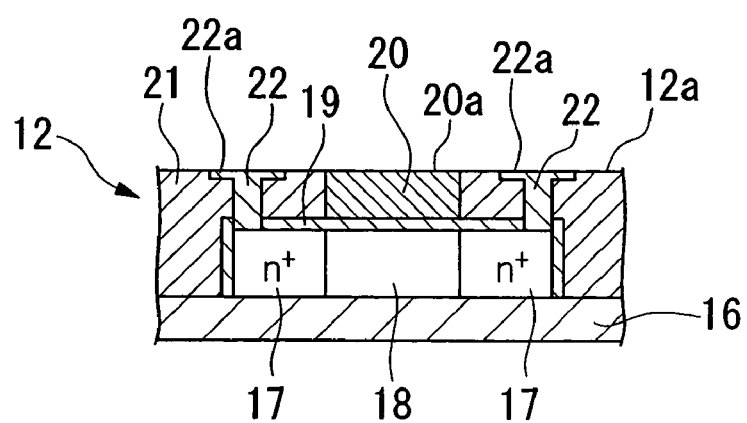

FIG. 2C is a cross-section showing an example of the element 12 used in the present embodiment. The element 12 is constructed to contain for example a TFT (thin film transistor) formed on an $SiO_2$ film (intermediate layer) 16. The TFT is equipped with a source and drain area 17 formed by introducing an n-type impurity to the polysilicon layer, a channel area 18, a gate insulating film 19, a gate electrode 20, an interlayer insulating film 21, and a source electrode 22 and drain electrode 22 composed of for example aluminum. Here, the elements 12 in the present invention, as shown in FIG. 2C, are formed in a condition where the terminal sections of the respective electrodes are exposed to a surface 12a on the opposite side to the separation layer 11. That is to say, the gate electrode 20 is formed with one surface (the surface on the opposite side to the channel area 18) exposed to the surface 12a of the element 12, and the source and drain electrodes 22 and 22 connecting to the source (or drain area) 17 are also formed with an end surface exposed to the surface 12a of the elements 12. On the end surface side of the source and drain electrodes 22 and 22, in order to sufficiently maintain the contact area of the conductive adhesive described later, terminal sections 22a and 22a are formed in a condition with their surroundings exposed to the surface 12a. Furthermore, the surface in the gate electrode 20 on the side exposed to the surface 12a, also becomes a terminal section 20a in the present invention.

The element 12 it is not limited to a TFT, and various elements such as a silicon base transistor, an SOI (silicon on insulator) and the like may be applied. However, in this case also, the terminal sections such as the electrodes are in a condition exposed to the surface on the opposite side to the separation layer 11.

Moreover, in the present invention, as the intermediate layer provided in contact with the separation layer 11, an $SiO_2$ film is used, however, other insulating films such as $Si_3N_4$ may be used. The thickness of the $SiO_2$ film (intermediate layer) is adequately determined corresponding to the purpose for the formation, and the degree of function to be demonstrated, however normally around 10 nm to 5 µm is preferable, and 40 nm to 1 µm is more preferable. The intermediate layer is formed for various purposes, and functions as at least one of; a protective layer for physically or chemically protecting the transferred layer (element 12), an insulating layer, a conductive layer, a shading layer to laser light, a barrier layer for preventing migration, and a reflection layer.

In some cases, the transferred layer (element 12) may be directly formed on the separation layer 11, by omitting the formation of the interlayer, such as the $SiO_2$ film.

The transferred layer (element 12) includes a thin film element such as a TFT, as shown in FIG. 2C. As a thin film element, besides the TFT, there are for example: thin film diodes, photoelectric transducers including a PIN junction of silicon (photosensor, solar battery), silicon resistive elements, other thin film semiconductor devices, electrodes (for example; transparent electrodes such as ITO and mesa film), switching devices, memories, actuators such as piezoelectric devices, micromirrors (piezoelectric thin film ceramics), magnetic recording thin film heads, coils, inductors, thin film high permeability materials and micro-magnetic devices composed of combinations thereof, filters, reflection films, dichroic mirrors, and the like.

Such a thin film element (thin film device) is normally formed by a comparatively high process temperature due to the forming method therefor. Therefore, in this case, as described above, the substrate 10 must be a highly reliable material which is resistant to this process temperature.

[Second Process]

Figure 3A:
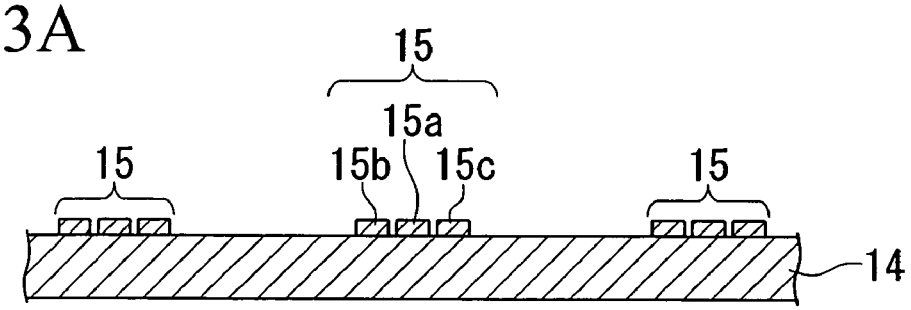
FIG. 3A is a side cross-section showing a condition where electrode pads are formed on a final substrate.

On the other hand, as shown in FIG. 3A, a final substrate 14 is prepared. The final substrate 14 is not specifically limited, and may be a substrate (plate material), specifically a transparent substrate. Such a substrate may be flat or curved. Further, the final substrate 14 may be inferior to the original substrate 10 in characteristics such as heat resistance, corrosion resistance, and the like. The reason is that; since in this embodiment, the elements 12 are formed on the original substrate 10, and then the elements 12 are transferred to the final substrate 14, the characteristics required for the final substrate 14, specifically heat resistance, are not dependent on the temperature conditions when forming the elements 12.

Therefore, if the maximum temperature when forming the element 12 is T max, a constituent for the final substrate 14 with a glass transition point (Tg) or a softening point below T max can be used. For example, the final substrate 14 can be formed from a material with a glass transition point or softening point preferably below 800° C., more preferably below 500° C., and even more preferably below 320° C.

As the mechanical characteristics of the final substrate 14, it is preferable to have a degree of rigidity (strength), however, it may have flexibility or elasticity.

As such a constituent for the final substrate 14, there are various synthetic resins or various glasses. In particular, various synthetic resins or normal (low melting point) low cost glass are preferable.

Examples of synthetic resins include both thermoplastic resins and thermosetting resins such as; polyolefins, e.g. polyethylene, polypropylene, ethylene-propylene copolymers, and ethylene-vinyl acetate copolymers (EVAs); cyclic polyolefins; modified polyolefins; polyesters such as polyvinyl chloride, polyvinylidene chloride, polystyrene, polyamides, poly-imides, polyamide-imides, polycarbonates, poly-(4-methylpentene-1), ionomers, acrylic resins, polymethyl methacrylate, acrylic-styrene copolymer (AS resin), butadiene-styrene copolymers, polio copolymers (EVOHs), polyethylene terephthalate (PET), polybutylene terephthalate (PBT), polycyclohexane terephthalate (PCT) and the like; polyethers, polyether-ketones (PEKs), polyether-etherketones (PEEKs), polyether-imides, polyacetals (POMs); polyphenylene oxides; modified polyphenylene oxides; polyalylates; aromatic polyesters (liquid crystal polymers), polytetrafluoroethylene, polyvinylidene fluoride, and other fluorine resins; various thermoplastic elastomers such as styrene-, polyolefin-, polyvinyl chloride-, polyurethane-, fluorine rubber-, chlorinated polyethylene-type, and the like; epoxy resins, phenol resins, urea resins, melamine resins, unsaturated polyesters, silicone resins, polyurethanes, and the like; and copolymers, blends, polymer alloys essentially consisting of these synthetic resins. One or more of these synthetic resins may be used in combination (for example, as a composite consisting of at least two layers).

Examples of glass include, silicate glass (quartz glass), alkaline silicate glass, soda-lime glass, potash lime glass, lead (alkaline) glass, barium glass, and borosilicate glass. All the types of glass other than silicate glass have lower melting points than that of silicate glass. Moreover, they are comparatively easy to form and process, and inexpensive, and therefore preferable.

Furthermore, as the final substrate 14, at the positions thereon for transferring the elements 12 to be transferred on the original substrate 10, electrode pads 15 are formed beforehand as conductive sections in the present invention. The electrode pads 15 are for respectively conducting with the terminal section 20a, and the terminal sections 22a and 22a shown in FIG. 2C of the elements 12 formed on the original substrate 10, and comprise electrode pads 15a, 15b and 15c provided at positions corresponding the respective terminal sections. In the present embodiment, as show in FIG. 3B, wiring 30 is also formed for connecting to these electrode pads 15a, 15b and 15c. Here, the electrode pads 15a, 15b and 15c, for example as shown in FIG. 3C, are arranged corresponding to the exposed terminal section 20a of the gate electrode 20, and the terminal sections 22a and 22a of the source electrode 22 and drain electrode 22, in the elements 12.

Figure 4:
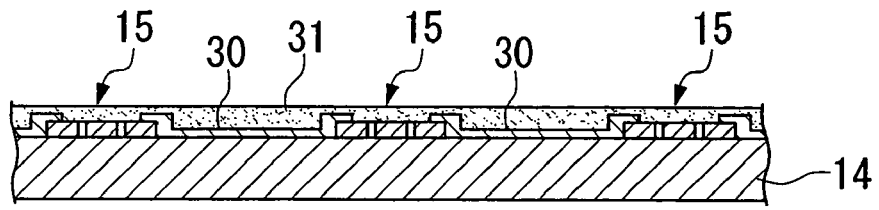
FIG. 4 is a side cross-section showing a condition where a film-like anisotropic conductive adhesive is adhered to a final substrate.

Next, in this manner, to the final substrate formed with the wiring 30, as shown in FIG. 4, film-like anisotropic conductive adhesive 31 is adhered as conductive adhesive to the formation surface of the electrode pad 15. The film-like anisotropic conductive adhesive 31 is not specifically limited, and various kinds can be used. Examples suitable for use include, "3370C" made by Three Bond Co., Ltd., "Anisorm" made by Hitachi Chemical Co., Ltd., and "CP9631SB" made by Sony Chemical Corporation. The film-like anisotropic conductive adhesive 31 is one where fine conductive particles are dispersed in an insulative resin and formed into a film-like adhesive, and it is constituted so as to be cured by heat pressing. Regarding the film-like anisotropic conductive adhesive 31 based on such a constitution, when pressed the dispersed fine conductive particles become continuous in the direction of pressing, and consequently it attains conductivity in the direction of pressing. At this time, in the non pressing direction the fine conductive particles remain in the dispersed condition, and hence it remains insulating.

Figure 5:
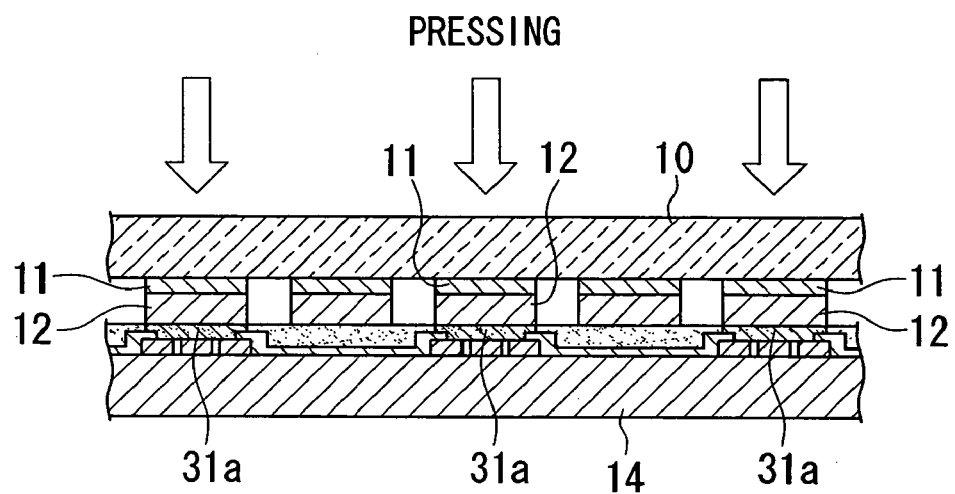
FIG. 5 is a side cross-section showing a process for superposing the original substrate on the final substrate and adhering them.

In this manner, after adhering the anisotropic conductive adhesive 31 onto the final substrate 14, then as shown in FIG. 5, the original substrate 10 is aligned relative to the final substrate 14, and adhered so that the element 12 side contacts with the anisotropic conductive adhesive 31. The alignment of the original substrate 10 to the final substrate 14, is performed so that the elements 12 to be transferred are positioned on the electrode pads 15, more precisely, so that the terminal sections 20a, 22a and 22a of the element 12 are respectively positioned immediately above the corresponding electrode pads 15a (15b, 15c).

Then, by pressing one or both of the substrates in a direction to adhere to each other, and by heating in this condition, the anisotropic conductive adhesive 31 is cured. In the present embodiment, as shown in FIG. 5, the original substrate 10 side is pressed. When conducting the press, the elements 12 to be transferred are selectively pressed, so that the anisotropic conductive adhesive 31 can be selectively pressed only at the places positioned immediately beneath the elements 12 to be transferred. Here, the heating for curing differs depending on the anisotropic conductive adhesive 31 used, and is performed at around 50° C. to 200° C. The thickness of the film-like anisotropic conductive adhesive 31 is not specifically limited, but is preferably around 1 μm to 100 μm.

In this manner, after selectively pressing the anisotropic conductive adhesive 31, and then curing by heating, the pressed area of the anisotropic conductive adhesive 31 becomes a conductive part 31a having conductivity in the pressing direction. Consequently, the terminal sections 20a, 22a and 22a of the element 12 respectively conduct with the corresponding electrode pads 15a (15b, 15c). Moreover, regarding the anisotropic conductive adhesive 31, since the insulativity is still retained in the non pressing direction, then between the terminal sections 20a, 22a and 22a of the element 12 and between the corresponding electrode pads 15a (15b, 15c), the mutual insulation remains, so that they are respectively electrically independent.

[Third Process]

In this manner, after adhering the elements 12 to be transferred on the original substrate 10, to the final substrate 14 via the anisotropic conductive adhesive 31, exfoliation is produced in the separation layer 11 between the original substrate 10 and the elements 12 to be transferred.

Figure 6:
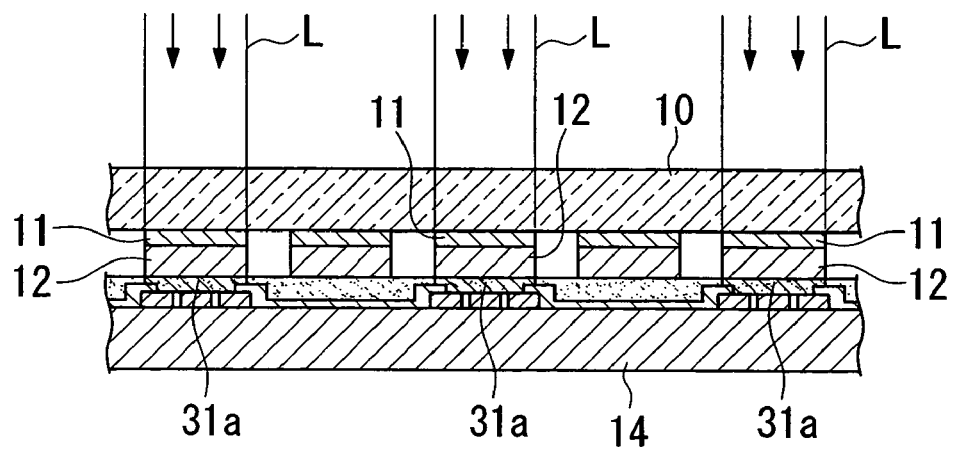
FIG. 6 is a side cross-section showing a process for producing exfoliation in a separation layer by partially irradiating light from the original substrate side.

In order to produce exfoliation in the separation layer 11, as shown in FIG. 6, a light L is selectively irradiated using a metal mask (not shown) or the like, from the original substrate 10 side to the separation layer 11 of the elements 12 to be transferred, so as to produce exfoliation in the separation layer 11 and/or at the interface. By producing exfoliation in this manner, the separation layer 11 is exfoliated and the elements 12 to be transferred are separated from the separation layer 11, giving the condition where these are adhered via the anisotropic conductive adhesive 31 to the final substrate 14 side.

The theory of the occurrence of internal exfoliation and/or interfacial exfoliation in the separation layer 11 presumes the occurrence of ablation in the constituents of the separation layer 11, the release of gas contained in the separation layer 11, or a phase transition such as melting or transpiration generated immediately after the irradiation.

The word "ablation" means that solid components (the constituents of the separation layer 11), which absorbed the incident light, are photochemically and thermally excited and atoms or molecules on the surface or inside the solid components are released by the chain scission. The ablation is mainly observed as phase transition such as melting or vaporization in the partial or entire constituents of the separation layer 11. Also, fine foaming may be formed by the phase transition, resulting in a decreased adhering force.

The internal and/or interfacial exfoliation of the separation layer 11 depends on the composition of the separation layer 11 and other factors, for example, the type, wavelength, intensity, and range of the incident light.

Any type of incident light which causes internal and/or interfacial exfoliation of the separation layer 11 can be used, for example, X-rays, ultraviolet rays, visible rays, infrared rays (heat rays), laser beams, milli-waves, micro-waves, electron rays, and radiations ($\alpha$-rays, $\beta$-beta rays, and $\gamma$-rays).

Among them, laser beams are preferable because they can easily cause exfoliation (ablation) of the separation layer 11, and are capable of highly accurate local irradiation. Laser light is coherent light and preferable for producing exfoliation at the desired part by irradiating the high powered pulse light the via the original substrate 10 onto the separation layer . Hence, by using laser light, it becomes possible to easily and reliably exfoliate the elements 12.

Examples of lasers generating the laser beams include various gas lasers and solid lasers (semiconductor lasers), and excimer lasers, Nd-YAG lasers, Ar lasers, $CO_2$ lasers, CO lasers, and He—Ne lasers may be preferably used.

The laser light preferably has a wavelength of 100 nm to 350 nm. In this manner, by using the short wavelength laser light, light irradiation accuracy becomes higher and the exfoliation in the separation layer 11 can be effectively performed.

Examples of laser light that satisfy the above conditions include excimer lasers. The excimer laser is a gas laser which is capable of outputting laser light with high energy in the short wavelength UV range. Four typical types of laser light can be output (XeF=351 nm, XeCl=308 nm, KrF=248 nm, ArF=193 nm) by combinations of rare gasses (Ar, Kr, Xe, and etc.) and halogen gasses ($F_2$, HCl, and etc.) as the laser media. Since the excimer laser outputs high energy in the short wavelength range, it can cause ablation of the separation layer 11 in an extremely short time. Hence it can exfoliate the separation layer 11 without deteriorating or damaging to the adjacent element 12.

Alternatively, in the case of imparting exfoliation characteristic to the separation layer 11 by causing phase changes such as gas evolution, vaporization and sublimation, the wavelength of the irradiating laser light is preferably around 350 nm to 1200 nm.

Laser light of such wavelengths may use a laser light source or irradiating device widely used in general processing fields, such as a YAG or gas laser, so that light irradiation can be performed easily at low cost. By using such laser light of wavelength in the visible light range, the original substrate 10 need only be visible light transmitting, thus widening the degree of freedom for selecting the original substrate 10.

Preferably, the energy density of the incident laser light, and particularly of the excimer lasers, ranges from approximately 10 to 5,000 $mJ/cm^2$, and more preferably approximately 100 to 500 $mJ/cm^2$. The irradiation time preferably ranges from 1 to 1,000 nsec., and more preferably from 10 to 100 nsec. At an energy density or irradiation time which is lower than the lower limit, satisfactory ablation will not occur, whereas at an energy density or irradiation time which is higher than the upper limit, the element 12 is adversely affected by the incident light passing through the separation layer 11.

As a solution to the case where the irradiating light which has passed through the separation layer 11 reaches and adversely affects the element 12, for example, there is a method where a metal film 11 such as tantalum (Ta) is formed on the separation layer 11. Accordingly, the laser light which has passed through the separation layer 11 is fully reflected at the interface of the metal film, and thus does not adversely affect the elements 12 thereabove.

It is preferable that the incident light including laser beams be incident on the separation layer with a uniform intensity. The incident light may be incident on the separation layer 11 from the direction perpendicular to the separation layer 11 or from a direction shifted by a given angle from the perpendicular direction.

The same position may be irradiated two or more times. Moreover, the same position or different positions may be irradiated with different types and/or wavelengths of incident (laser) light beams two or more times.

[Fourth process]

Figure 7:
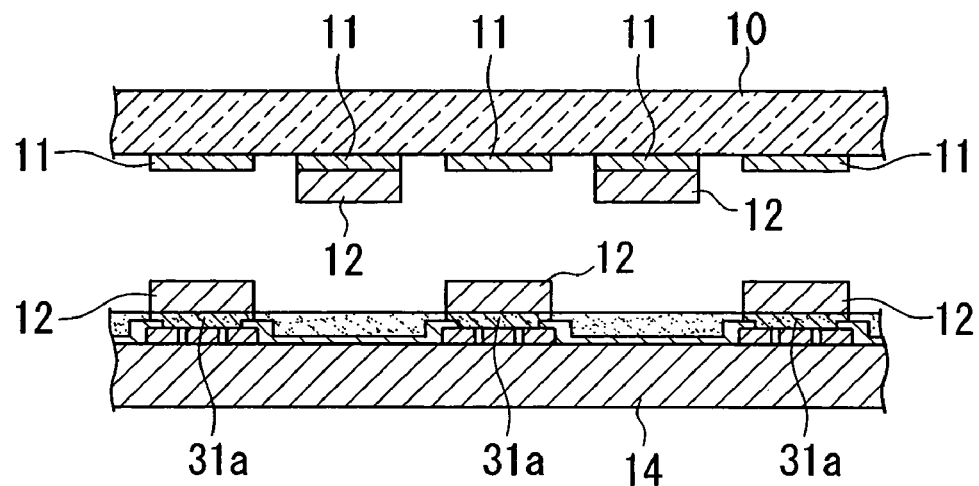
FIG. 7 is a side cross-section showing a process for removing the original substrate from the final substrate after transferring.

Next, as shown in FIG. 7, by applying a force on the original substrate 10 and the final substrate 14 in a direction to separate both, the original substrate 10 is removed from the final substrate 14. Here, since by the third process, the separation layer 11 of the elements 12 to be transferred to the final substrate 14 has been exfoliated from the elements 12, the elements 12 to be transferred are separated from the original substrate 10. Moreover, the elements 12 to be transferred are adhered by the anisotropic conductive adhesive 31 to the desired position of the final substrate 14, namely the electrode pads 15 in the present embodiment.

In the third process, it is desirable to produce complete exfoliation in the separation layer 11. However, if the adhesive strength of the anisotropic conductive adhesive 31 for adhering the elements 12 to be transferred is superior to the adhesive strength due to the remaining separation layer 11, so that as a result when the original substrate 10 and the final substrate 14 are separated, the elements 12 to be transferred are reliably transferred to the final substrate 14 side, then exfoliation need only be produced in a part of the separation layer 11.

By separating the original substrate 10 from the final substrate 14, as shown in FIG. 7, the elements 12 are transferred to the plural positions on the final substrate 14.

Here, regarding the film-like anisotropic adhesive 31, at the places corresponding to the elements 12 which are not transferred, adhesion by pressing has not eventuated, and hence sufficient adhesion between the elements 12 which are not transferred has not eventuated. Therefore, since the separation layer 11 of the elements 12 which are not transferred is not exfoliated, the adhesive strength between the elements 12 and the anisotropic conductive adhesive 31 is opposed so that they easily peel off. As a result, the original substrate 10 is easily separated from the final substrate 14.

The original substrate 10 on which untransferred elements 12 remain, can be used for successively transferring many elements 12 onto areas of the same final substrate 14 where the elements 12 have not been transferred, or onto another final substrate 14, by repeating the second and third processes. That is to say, in the case where the manufacturing method for a device of the present invention is applied, for example, to a manufacturing method for an active matrix substrate for an electro-optic device, microscopic elements 12 such as TFTs can be dispersingly arranged effectively for each of the many pixels on the substrate.

There may be a case where the exfoliation residue of the separation layer 11 is adhered on the element 12 transferred to the final substrate 14, and it is desirable to completely remove this. A method for removing the residual separation layer 11 may involve suitably selecting and using such methods as, for example, washing, etching, ashing, grinding, or a combination of these.

Figure 8:
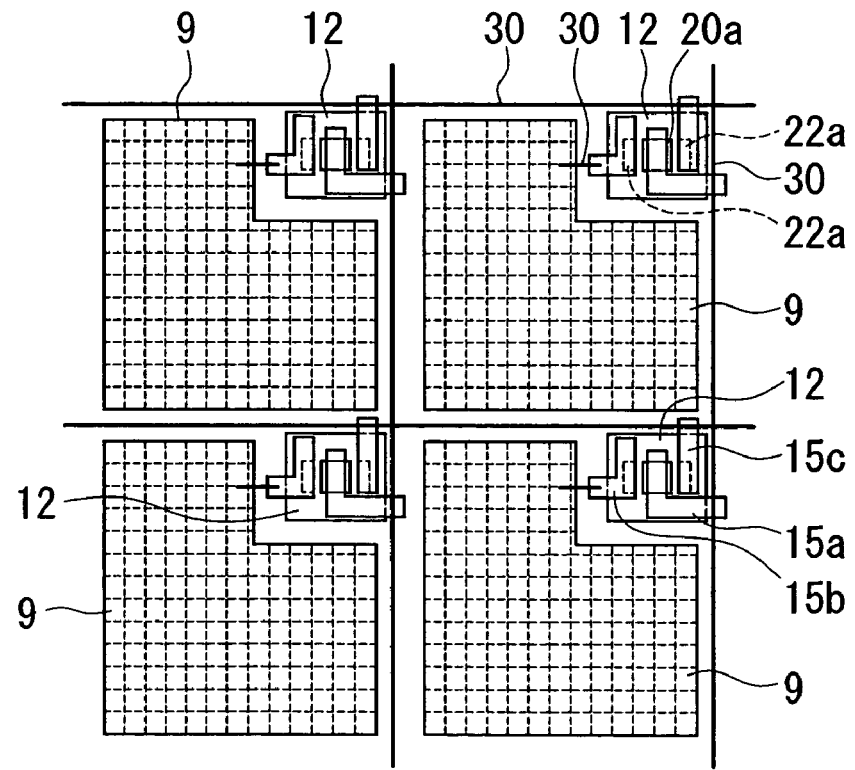
FIG. 8 is a schematic diagram for explaining a condition where many elements are transferred onto the final substrate.

Through the abovementioned respective processes it is possible to selectively transfer the many elements 12 to be transferred onto the final substrate 14, in the condition as shown in FIG. 8, where the terminal sections 20a, 22a, and 22a are respectively adhered to the electrode pads 15a, 15b and 15c. FIG. 8 is a schematic diagram of an active matrix substrate which is a component of an active matrix type liquid crystal electro-optic device. Reference symbol 9 in FIG. 8 denotes pixel electrodes.

Then, the transferred elements 12 are connected for example, via the electrode pad 15 and the previously formed wiring 30, to components on the final substrate 14 by other wiring; and are covered by a desired protective film, and furthermore, a device is formed by combining the finally obtained device with other components.

According to such a device manufacturing method, the many elements 12 which are to be dispersingly arranged at intervals on the final substrate 14 can be concentratedly manufactured on the original substrate 10. Hence, compared to the case where the elements 12 are directly formed on the final substrate 14, the area efficiency in the manufacture of the elements 12 can be greatly increased, and a final substrate 14 with the many elements 12 dispersingly arranged can be effectively manufactured at low cost.

Moreover, it becomes easily feasible to select and remove before transfer, the many elements 12 which are concentratedly manufactured on the original substrate 10. As a result product yield rate can be increased.

Furthermore, since the surface 12a where the terminal sections 20a, 22a and 22a of the transferred elements 12 are exposed is adhered via the film-like anisotropic conductive adhesive 31 to the final substrate 14, the anisotropic conductive adhesive 31 is directly adhered to the electrode pads 15 on the final substrate 14. Hence, adhesion of the elements 12 to the final substrate 14 and conduction of the terminal sections 20a, 22a and 22a with the electrode pads 15a, 15b and 15c can be performed at the same time. Consequently, the process after transferring, for conducting the terminal sections with the electrode pad 15 by wiring is obviated, enabling simplification of the processes.

Moreover, since the original substrate 10 is substrate for forming the elements, then when forming the elements 12 on the original substrate 10, the terminal sections 20a, 22a and 22a should be provided on the side opposite to the original substrate 10, that is, the outer side. Hence, it is easy to form the terminal sections 20a, 22a and 22a.

Furthermore, since, the conductive adhesive is an anisotropic conductive adhesive 31, the electrode pads 15a (15b, 15c) are each made independently conducting with the many terminal sections 20a, 22a and 22a of the elements 12. The terminal sections and the corresponding electrode pads are arranged to oppose each other, and adhered by the anisotropic conductive adhesive 31 and pressed. As a result, that the anisotropic conductive adhesive 31 demonstrates its anisotropy and conducts only between the opposing terminal sections, and electrode pads. Consequently, productivity can be made extremely good.

Moreover, since the film-like adhesive is used as the anisotropic conductive adhesive 31 being a conductive adhesive, handling is facilitated. Hence productivity can be increased.

Furthermore, it is possible to laminate and unite the same or different elements 12. Therefore, by uniting the elements manufactured under different process conditions, an element having a laminated structure which is conventionally difficult to manufacture can be provided, and an element having a three-dimensional structure can be easily manufactured.

Moreover, in the device obtained in this manner, since the surface 12a where the terminal sections 20a, 22a and 22a of the elements 12 are exposed is adhered via the anisotropic conductive adhesive 31 to the electrode pads 15 on the substrate (final substrate 14), then during the manufacture, a process for mounting the elements 12 on the substrate (final substrate 14) and a process for conducting the terminal sections 20, 22a and 22a of elements 12 with the electrode pads 15 of the substrate (final substrate 14) are performed at the same time. Consequently, the process after the mounting, for conducting the terminal sections 20, 22a and 22a with the electrode pads 15 by wiring becomes unnecessary, giving high productivity.

In the device obtained by such manufacturing methods, since the elements 12 constituting this are accurately positioned on the final substrate 14, then different from the macrostructure used in the conventional microstructure arrangement techniques, the extra symmetrical circuit structure becomes unnecessary. Hence, extremely small microscopic blocks on which are formed only the circuits to meet minimum requirements are possible. Therefore, a very large number of elements 12 can be concentratedly manufactured on the original substrate 10 and the cost per element is greatly reduced, so that the device itself is also reduced in cost.

Figure 9:
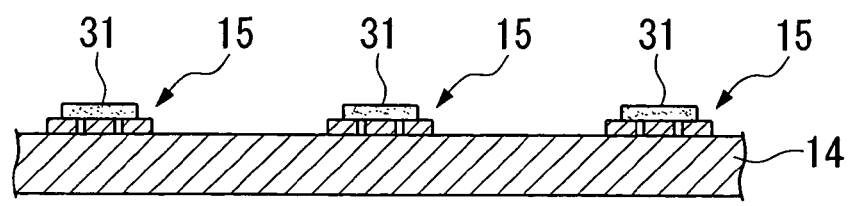
FIG. 9 is a side cross-section showing a condition where film-like anisotropic conductive adhesive is adhered only to the element transferring area of the final substrate.

In the example, the film-like anisotropic conductive adhesive 31 serving as the conductive adhesive has its whole surface affixed to the final substrate. However, as shown in FIG. 9, this may be affixed only on the element transferring area of the final substrate 14, that is, on the electrode pads 15. In this case, the wiring 30 for connecting to the electrode pads 15a, 15b and 15c, may be performed after transferring the elements rather than being pre-formed. However, in this case, the whole surface of the electrode pads 15a, 15b and 15c is not covered by the anisotropic conductive adhesive 31.

Furthermore, the film-like anisotropic conductive adhesive 31 may be affixed to the terminal section forming surface of the elements 12, rather than to the electrode pads 15.

If so the adhesion of the original substrate 10 to the final substrate 14 by pressing can be performed by appropriately pressing over the whole surface, rather than being selectively performed.

(Second Embodiment)

The difference of the second embodiment to the first embodiment is the point that anisotropic conductive adhesive in paste form, that is, in liquid form, is used as the conductive adhesive, instead of the film-like anisotropic conductive adhesive.

Figure 3B:
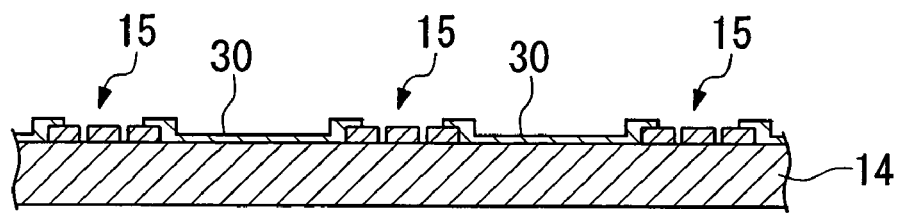
FIG. 3B is a side cross-section showing a condition where wiring 30 is connected to the electrode pads.
Figure 3C:
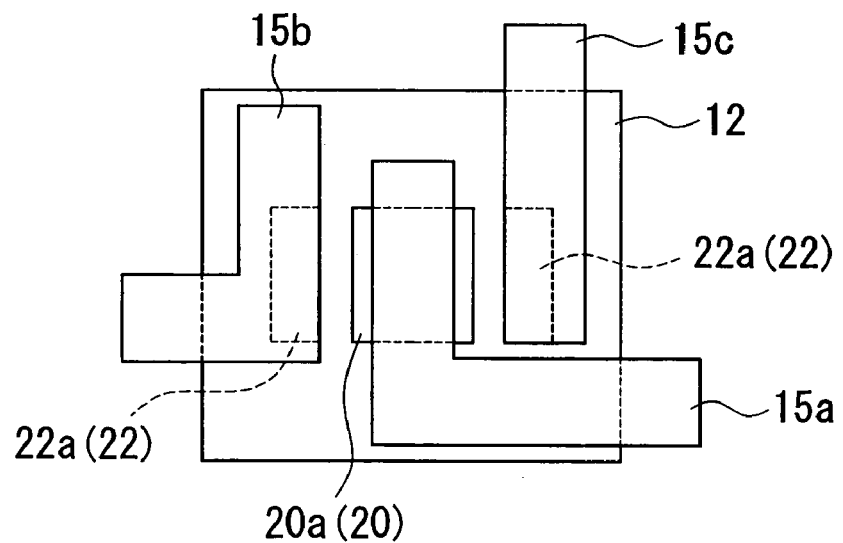
FIG. 3C is a bottom view schematically showing an arrangement of terminal sections of elements and the electrode pads.
Figure 10:
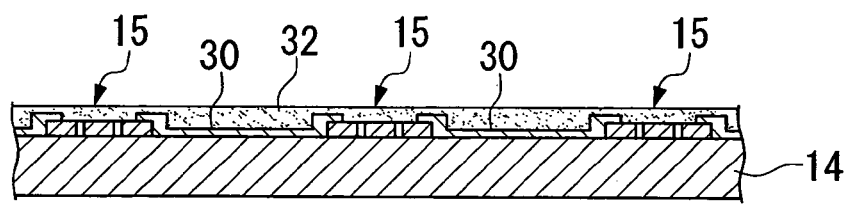
FIG. 10 is a side cross-section showing a condition where liquid form anisotropic conductive adhesive is applied onto the whole surface of the final substrate by spin coating.

In this embodiment, the final substrate 14 shown in FIG. 3B formed with the wiring 30 for connecting to the electrode pads 15a, 15b, 15c is prepared, and liquid form anisotropic conductive adhesive 32 as shown in FIG. 10 is applied on this over the whole surface by spin coating.

The liquid form (paste form) anisotropic conductive adhesive 32 is not specifically limited, and various kinds can be used. Examples suitable for use include "3370G" made by Three Bond Co., Ltd. This anisotropic conductive adhesive 32, as with the film-like anisotropic conductive adhesive 32, is also formed by dispersing fine conductive particles in an insulative paste, and it is constituted so as to be cured by heat pressing.

After whole surface application of this liquid form anisotropic conductive adhesive 32 onto the final substrate 14 by spin coating, the original substrate 10 is adhered via the anisotropic conductive adhesive 32 onto the final substrate 14. Then, similarly to the first embodiment, only the places immediately below the elements 12 are selectively pressed and heated, so that the anisotropic conductive adhesive 31 is cured. Here, the heating for curing also differs depending on the anisotropic conductive adhesive 32 used, but is performed at around 50° C. to 200° C. The thickness of the liquid form anisotropic conductive adhesive 32, it is not specifically limited, but is preferably around 1 μm to 100 μm.

Hereunder, similarly to the first embodiment, exfoliation and separation of substrates is performed, to form the device.

Also with such a device manufacturing method, and the device obtained by this, similar effects to the case of the first embodiment can be obtained.

Specifically, since the liquid form anisotropic conductive adhesive 32 is used as the anisotropic conductive adhesive, the whole surface application can be easily performed by spin coating. Hence productivity can be increased.

(Third Embodiment)

The difference of the third embodiment to the second embodiment is the point that the liquid form anisotropic conductive adhesive 32 is selectively arranged by a liquid droplet discharge method such as an inkjet method, a dispenser method, or the like, instead of whole surface application by spin coating.

Figure 11:
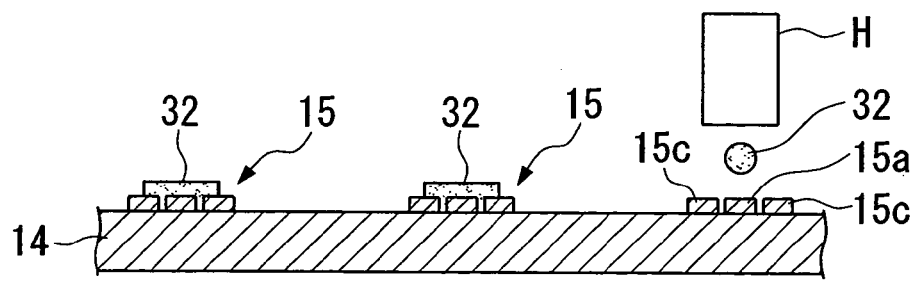
FIG. 11 is a side cross-section showing a condition where liquid form anisotropic conductive adhesive is arranged on the electrode pads of the final substrate by a liquid droplet discharge method.

In this embodiment, the final substrate 14 shown in FIG. 3B formed with the wiring 30 for connecting to the electrode pads 15a, 15b and 15c may be used. However, as shown in FIG. 11, the final substrate 14 formed with only the electrode pads 15a, 15b and 15c before forming the wiring 30 may also be used.

In the case where the final substrate formed with the only the electrode pads 15a, 15b and 15c is used, the anisotropic conductive adhesive 32 being in liquid form is discharged from a droplet discharge section, for example, an inkjet head H, so as not to cover the whole surface of these electrode pads 15a, 15b and 15c. Discharge of the anisotropic conductive adhesive 32 may be performed not for the final substrate 14 but for the terminal section forming surface 12a.

Figure 12A:
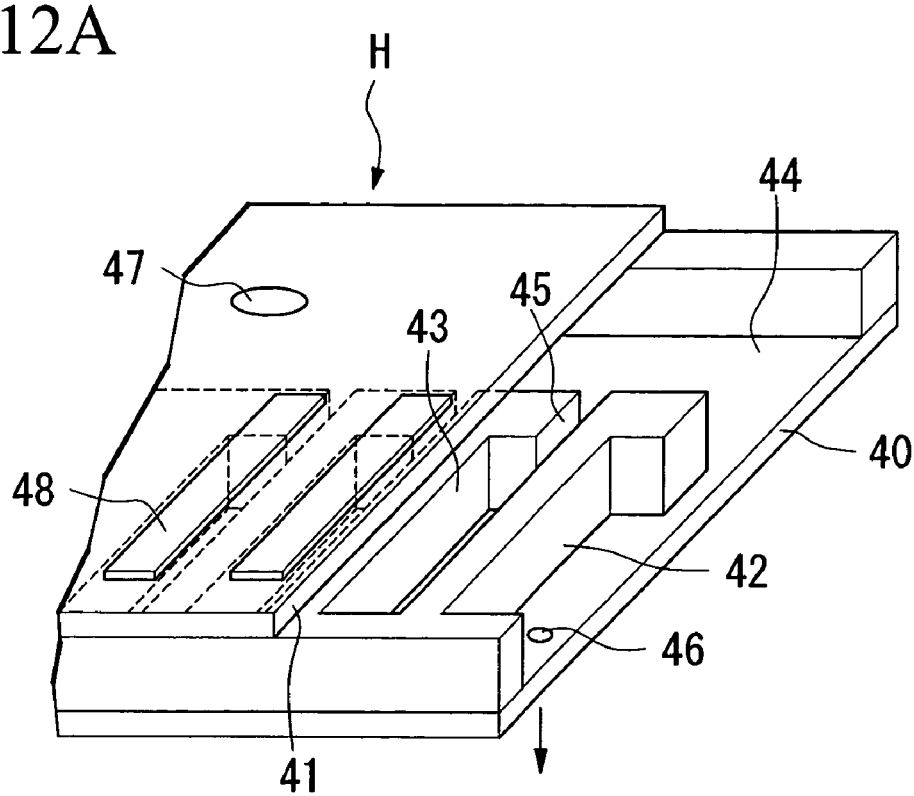
FIGS. 12A and 12B are diagrams for explaining the schematic configuration of an inkjet head.

To describe an example of the construction of the inkjet head H, the inkjet head H, as shown in FIG. 12A, comprises for example a nozzle plate 40 made from stainless steel and a diaphragm 41, with both connected via a partition member (reservoir plate) 42. Between the nozzle plate 40 and the diaphragm 41 are formed by means of the partition member 42, a plurality of cavities 43 and liquid reservoirs 44. The respective cavities 43 and the interior of the liquid reservoirs 44 are filled with discharge liquid, and the cavities 43 and the liquid reservoirs 44 are communicated via a supply port 45. In the nozzle plate 40 are formed nozzles 46 for discharging the discharge liquid from the cavities 43. On the other hand, in the diaphragm 41 is formed a hole 47 for supplying the discharge liquid to the liquid reservoirs 44.

Figure 12B:
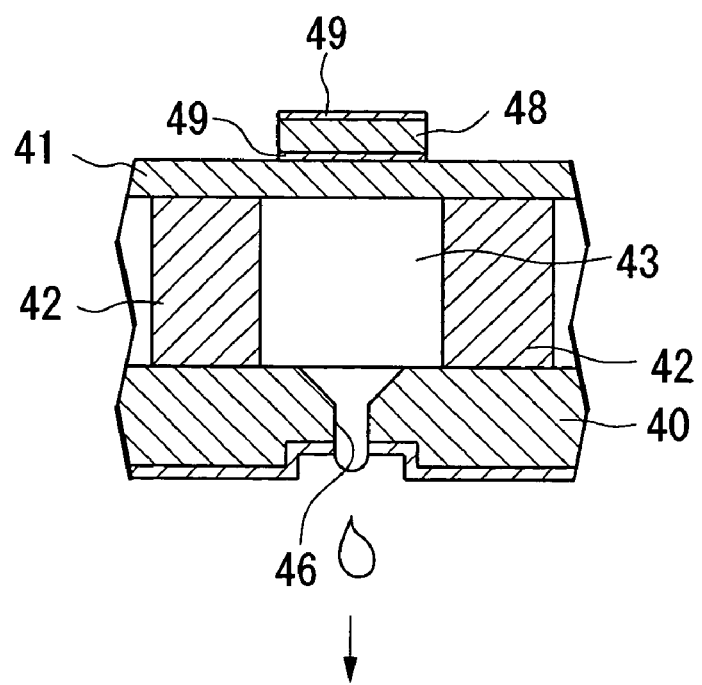

As shown in FIG. 12B, piezoelectric elements (piezo device) 48 are attached to the surface of the diaphragm 41 on the opposite side to the surface facing the cavities 43. The piezoelectric elements 48 are positioned between a pair of electrodes 49, and configured so as to flex and protrude outwards when energized. Based on such a configuration, the diaphragm 41 to which the piezoelectric element 48 is attached, is integrated with the piezoelectric element 48 and thus flexes outwards at the same time. As a result, the volume of the cavity 43 increases. Consequently, discharge liquid equivalent to the increased volume flows in to the interior of the cavity 43 from the liquid reservoir 44 via the supply port 45. Furthermore, when from such a condition, energizing of the piezoelectric element 48 is terminated, both the piezoelectric element 48 and the diaphragm 41 return to their initial shapes. Therefore, the cavity 43 returns to the initial volume, and hence the pressure of discharge liquid inside of cavity 43 increases, and a droplet L of the anisotropic conductive adhesive 32 being the discharge liquid is discharged from the nozzle 46 towards the final substrate 14.

The inkjet method for the inkjet head H, is not limited to the piezo jet type using the piezoelectric element 48, and various methods can be adopted.

In this manner, once the anisotropic conductive adhesive 32 has been selectively applied onto electrode pads 15 on the final substrate 14, or onto the terminal section forming surface 12a of the elements 12, the original substrate 10 is adhered via this anisotropic conductive adhesive 32, onto the final substrate 14. Then, similarly to the second embodiment, pressing and heating is performed so that the anisotropic conductive adhesive 31 is cured. Furthermore, wiring (not shown) for connecting to the electrode pads 15a, 15b and 15c is formed. However, in this case, since the anisotropic conductive adhesive 32 is selectively applied previously, the adhesion of the original substrate 10 to the final substrate 14 by pressing is not selectively performed, and can be performed by suitably pressing over the whole surface.

Hereunder, similarly to the first embodiment, exfoliation and separation of the substrates is performed to form the device.

Also with such a device manufacturing method, and the device obtained by this, similar effects to the case of the first embodiment can be obtained.

Furthermore, since the liquid form anisotropic conductive adhesive 32 can be selectively arranged as the conductive adhesive on only the desired positions, then by selectively arranging the anisotropic conductive adhesive 32 onto the electrode pads 15 on the final substrate 14, loss of adhesive can be reduced. Moreover, transfer of the elements to the final substrate can be done easily.

(Fourth Embodiment)

The difference of the fourth embodiment to the third embodiment is the point that instead of selectively arranging the liquid form anisotropic conductive adhesive 32 by the liquid droplet discharge method, this is selectively applied by screen printing. The process after application is the same as for the third embodiment.

In this way, as well as obtaining similar effects to the case of the first embodiment, the effect of reducing the loss of the adhesive can be also obtained.

(Fifth Embodiment)

The difference of the fifth embodiment to the third embodiment is the point that instead of selectively arranging the liquid form anisotropic conductive adhesive 32 by the liquid droplet discharge method, this is selectively applied a stamper.

Figure 13A:
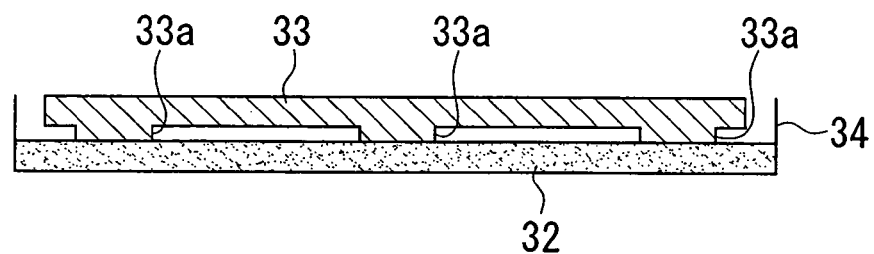
FIG. 13A to 13C are side cross-sections for explaining a method of applying an anisotropic conductive adhesive using a stamper.
Figure 13B:
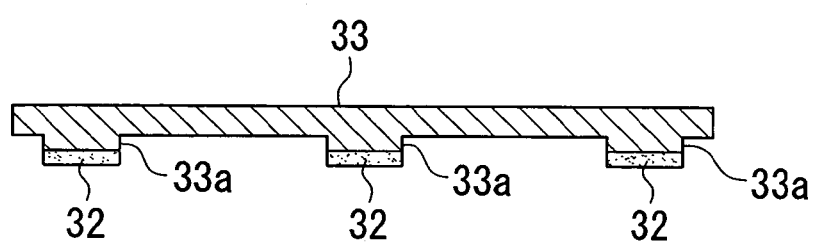
Figure 13C:
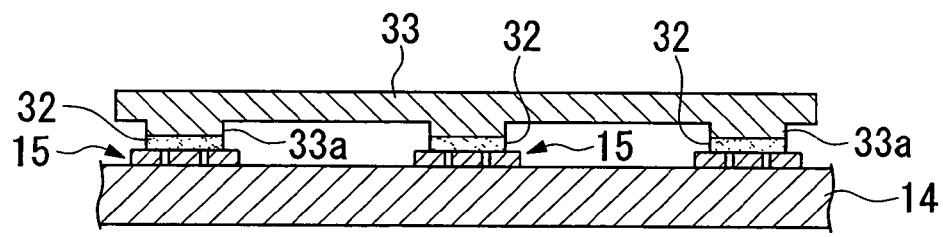

That is to say, in the fifth embodiment, as shown in FIG. 13A, a stamper 33 having convex application sections 33a at positions for applying the anisotropic conductive adhesive 32 is prepared. This stamper 33 is inserted into a container 34 storing the anisotropic conductive adhesive 32, and as shown in FIG. 13B, the anisotropic conductive adhesive 32 adheres to the application sections 33a. Next, as shown in FIG. 13C, the stamper 33 is aligned on the final substrate 14 or on the original substrate 10, and in this condition, the application sections 33 are pressed for a predetermined time onto the electrode pads 15 of the final substrate 14 or onto the elements 12 of the original substrate 10, and then separated. Therefore, the anisotropic conductive adhesive 32 which is adhered onto the application sections 33a shifts onto the electrode pads 15 or the elements 12. As a result, the anisotropic conductive adhesive 32 is selectively applied.

The processes after application are the same as for the third embodiment.

In this way, as well as obtaining a similar effect to the case of the first embodiment, the effect of being able to reduce the loss of the adhesive is also obtained. Moreover, this gives a superior method for mass production.

(Sixth Embodiment)

The difference of the sixth embodiment to the third embodiment is the point that, prior to selectively arranging of the liquid form anisotropic conductive adhesive 32 by the liquid droplet discharge method, partitions are formed for enclosing the positions where the anisotropic conductive adhesive 32 is arranged. Then the anisotropic conductive adhesive 32 is selectively arranged within these partitions.

Figure 14:
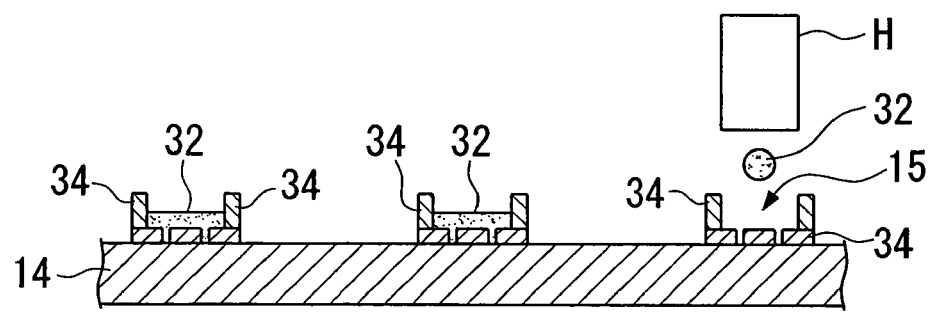
FIG. 14 is a side cross-section showing a condition where liquid form anisotropic conductive adhesive is arranged on the electrode pads of the final substrate using partitions, by a liquid droplet discharge method.

That is to say, in the sixth embodiment, as shown in FIG. 14, on the electrode pads 15 of the final substrate 14, partitions 34 are formed at peripheral portions enclosing the central upper surface of the electrode pads 15. Then, the anisotropic conductive adhesive 32 is selectively arranged inside the partitions 34, by a liquid droplet discharge method such as the inkjet method or a dispenser method (FIG. 14 shows the case performed by the inkjet method). The partitions 34 are formed by applying resin such as resist and then patterning by a photolithography technique. Further, after applying the anisotropic conductive adhesive 32, the partitions 34 are removed by etching.

The processes after applying the anisotropic conductive adhesive 32 in this manner and then removing the partitions 34, are the same as for the third embodiment.

In this way, as well as obtaining a similar effect to the case of the first embodiment, by discharging the anisotropic conductive adhesive 32 into the partitions 34 to arrange this, the anisotropic conductive adhesive 32 can be more reliably applied to the desired positions.

(Seventh Embodiment)

The difference of the seventh embodiment to the third embodiment is the point that prior to selectively applying the anisotropic conductive adhesive 32 onto the final substrate 14, concavities are formed in the final substrate 14 at junction positions with the elements 12, and then anisotropic conductive adhesive 32 is selectively arranged inside the concavities.

Figure 15:
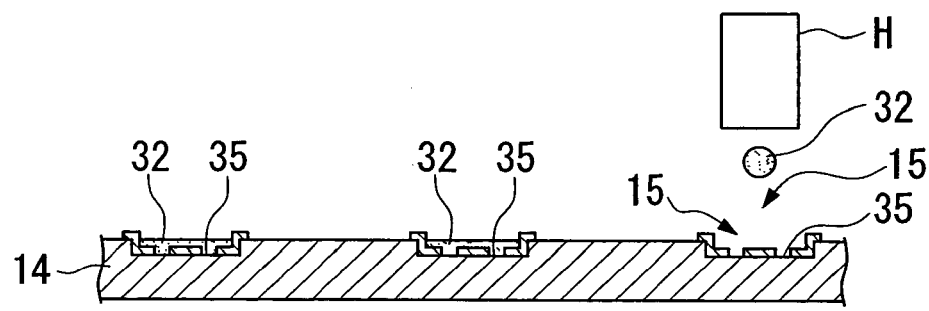
FIG. 15 is a side cross-section showing a condition where liquid form anisotropic conductive adhesive is arranged inside concavities in the final substrate, by a liquid droplet discharge method.

That is to say, as shown in FIG. 15, using a photolithography technique or an etching technique on the final substrate 14, concavities 35 are formed, and the electrode pads 15 are formed inside the concavities 35 and at the peripheries. After this, the anisotropic conductive adhesive 32 is selectively applied into the concavities 35.

The processes after application are the same as for the third embodiment.

In this way, as well as obtaining a similar effect to the case of the first embodiment, by discharging the anisotropic conductive adhesive 32 into the concavities 35 to arrange this, the anisotropic conductive adhesive 32 can be more reliably applied to the desired position.

Furthermore, for example, if the concavities 35 are formed into shapes to fit the elements 12, then the alignment when adhering the substrate 10 for transferring and the final substrate 14 can be performed by fitting the elements 12 to the concavities 35. Therefore, alignment when adhering the substrate pairs can be performed easily and accurately.

Furthermore, by fitting the elements 12 into the concavity 35, the film thickness of the substrate mounting the elements 12 (the final substrate 14) can be made thinner.

(Eighth Embodiment)

The difference of the eighth embodiment to the third embodiment is the point that prior to selectively applying the anisotropic conductive adhesive 32 onto the final substrate 14, the position where the anisotropic conductive adhesive 32 is arranged on the elements 12 or on the final substrate 14 is subjected to a lyophilic treatment, and/or the periphery of the position where the anisotropic conductive adhesive 32 is arranged is subjected to a liquid repellent treatment.

Here the liquid repellent treatment can be performed for example by forming a SAM (Self Assembled Mono layer) film using a fluororesin such as hexafluoropolypropylene. On the other hand, as the lyophilic treatment, lyophilication of the irradiated parts can be performed by selectively performing ultraviolet irradiation using a mask, on the liquid repellent treated area. Furthermore, apart from the liquid repellent treatment, by performing plasma processing with oxygen as the process gas, on the desired area, it is possible to treat the surface to make the desired part lyophilic.

Then, for example, on the electrode pads 15, the parts except for the area for connecting the wiring 30 are made lyophilic, or the area for connecting the wiring 30 is made liquid repellent, and in this condition, the anisotropic conductive adhesive 32 is discharged and arranged on the lyophilic treated part by the liquid droplet discharge method.

In this way, even if the anisotropic conductive adhesive 32 is discharged shifted from the desired position, due to the liquid repellent treatment at the shifted position, the anisotropic conductive adhesive 32 is repelled to the desired position, and as a result, is applied to the desired position. Furthermore, the anisotropic conductive adhesive 32 discharged to the desired position, due to the lyophilic treatment, stays in the position and does not flow to the surroundings.

Hence, according to the eighth embodiment, as well as obtaining a similar effect to the case of the first embodiment, the anisotropic conductive adhesive 32 can be more reliably applied to the desired position.

In the above embodiments, anisotropic conductive adhesive is used as the conductive adhesive, however, the present invention is not limited to this, and general conductive adhesive may be used rather than such anisotropic conductive adhesive, that is to say, conductive adhesive film, or conductive adhesive paste. Here, examples of conductive adhesive film suitable for use include "3316" made by Three Bond Co., Ltd. Furthermore, examples of conductive adhesive paste include "3301" made by Three Bond Co., Ltd., "Unimec conductive paste" made by NAMICS Corporation, and "Ombond" made by OMRON Corporation.

Such conductive adhesive film or conductive adhesive paste, in the case where there is one terminal section for the element 12 to be transferred, can be used similarly to the abovementioned film-like anisotropic conductive adhesive 31 in the first embodiment, or the paste form anisotropic conductive adhesive 32 in the second embodiment.

In the case where there are plural terminal sections for the element 12, it is necessary to form the conductive adhesive for adhering to these terminal sections in the condition of independence for each of the respective terminal sections, and to insulate between the independent conductive adhesives. The reason for this is so that short-circuits between the terminal sections by the conductive adhesive can be prevented.

Hereunder embodiments are illustrated for the case where there are plural terminal sections for the elements 12.

(Ninth Embodiment)

The difference of the ninth embodiment to the third embodiment is the point that, as described above, the conductive adhesive is not anisotropic conductive adhesive but general conductive adhesive, and the point that the conductive adhesive is made in a condition of independence by positioning apart for each of the respective terminal sections, to thereby insulate between the conductive adhesives.

Figure 16:
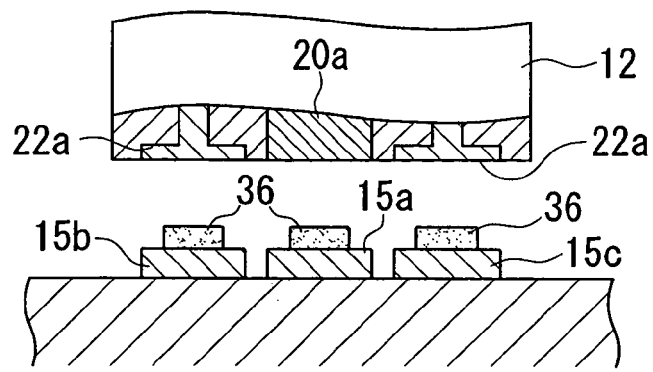
FIG. 16 is a side cross-section showing a condition where conductive adhesive is independently provided for the electrode pads formed on the final substrate.

That is to say, as shown in FIG. 16, for the electrode pads 15a, 15b and 15c formed on the final substrate 14, there is provided independently for each, film-like, or paste-like (liquid form) conductive adhesive 36. Next, the original substrate (not shown) is adhered, and the respective terminal sections 20a, 22a and 22a of the elements 12 are adhered via the conductive adhesive 36 to the corresponding electrode pads 15a (15b, 15c). Then, as necessary, the conductive adhesive 36 is cured by heat treatment or the like.

The processes after providing the conductive adhesive 36 in this manner and then curing as necessary, are the same as for the first embodiment or the third embodiment.

In this way, since the surface where the terminal sections 20a, 22a and 22a of the elements 12 are exposed are adhered via the conductive adhesive 36 to the electrode pads 15a (15b, 15c) on the final substrate 14, then during manufacture, the process for mounting the elements 12 on the final substrate 14, and the process for conducting the terminal sections 20a, 22a, 22a of the elements 12 with the electrode pads 15 of the final substrate 14 can be performed at the same time. Hence, the process for conducting the terminal sections 20a, 22a and 22a with the electrode pads 15 by wiring after mounting can be eliminated, and the processes thus simplified.

Furthermore, despite of using general conductive adhesive 36 which is not anisotropic, short-circuits between the terminal sections 20a, 22a and 22a by the conductive adhesive 36 can be reliably prevented.

When arranging the conductive adhesive 36 separated for each of the respective terminal sections, it is preferable to do this using paste form adhesive which can be changed to liquid form, as the conductive adhesive 36, and selectively apply this by the liquid droplet discharge method. In this case, it is preferable to more reliably perform the selective application of the conductive adhesive 36 by performing the lyophilic treatment and the liquid repellent treatment illustrated in the eighth embodiment.

(Tenth Embodiment)

The difference of the tenth embodiment to the ninth embodiment is the point that, as a method for making the conductive adhesive 36 in an independent insulated condition for each of the respective terminal sections, the conductive adhesive 36 is separated by insulative partitions.

Figure 17:
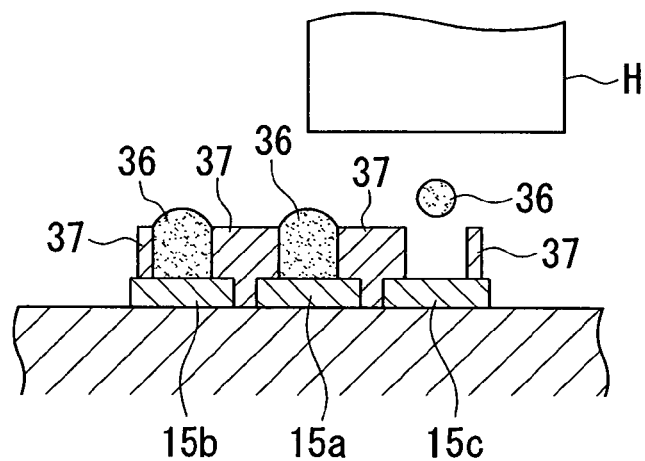
FIG. 17 is a side cross-section showing a condition where conductive adhesive is independently provided for the electrode pads formed on the final substrate by forming partitions.

That is to say, in the tenth embodiment, as shown in FIG. 17, for each of the electrode pads 15a, 15b and 15c corresponding to the respective terminal sections 20a, 22a and 22a, an insulative partition 37 is formed similarly to with the sixth embodiment, and the partition 37 formed by this, functions to separate between the electrode pads 15a and 15b, and also between the electrode pads 15b and 15c. When forming the partitions 37, in the case where the wiring 30 is connected to the electrode pads 15a, 15b and 15c by a subsequent process, the arrangement is such that the connection parts remain out of the partition 37.

Then, after forming the partitions 37 in this way, paste form adhesive which is adjustable to liquid form is used as the conductive adhesive 36, and this is selectively discharged and arranged inside the partitions 37 by the liquid droplet discharge method. Next, the original substrate (not shown) is adhered, and the respective terminal sections 20a, 22a and 22a of the elements 12 are adhered via the conductive adhesive 36 to the corresponding electrode pads 15a (15b, 15c). Then the conductive adhesive 36 is cured by heat treatment or the like.

After curing the conductive adhesive 36 in this way, the wiring 30 is connected to the electrode pads 15a, 15b and 15c as necessary, and thereafter the subsequent processes are performed similarly to with the third embodiment.

In this way, similarly to with the ninth embodiment, the process for conducting the terminal sections 20a, 22a and 22a with the electrode pads 15 by wiring after mounting of the elements 12 can be eliminated, and the processes thus simplified.

Furthermore, since between the terminal sections 20a and 22a (between the electrode pads) is insulated by the partitions 37 which give separation, short-circuits between the terminal sections 20a, 22a and 22a by the conductive adhesive 36 can be reliably prevented.

In the tenth embodiment, after curing the conductive adhesive 36, the arrangement of the ninth embodiment can be obtained by selectively removing (etching) only the partition 37.

(Eleventh Embodiment)

The difference of the eleventh embodiment to the ninth embodiment is the point that as a method for making the conductive adhesive 36 in an independent insulated condition for each of the respective terminal sections, the conductive adhesive 36 is arranged inside respective independent concavities.

Figure 18:
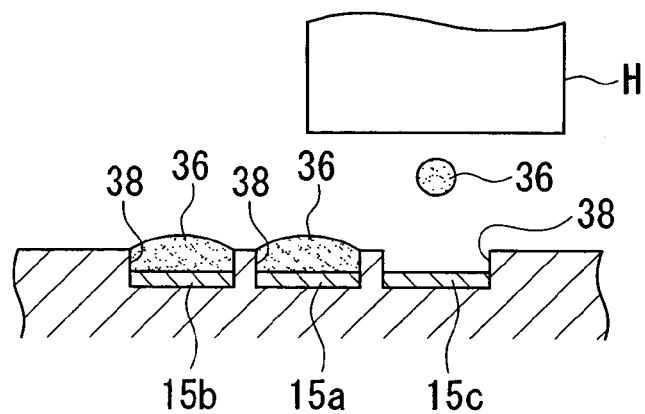
FIG. 18 is a side cross-section showing a condition where conductive adhesive is provided inside concavities formed in the final substrate.

That is to say, in the eleventh embodiment, as shown in FIG. 18, respective independent concavities 38 are formed in the surface layer portion of the final substrate 14, and the electrode pads 15a, 15b and 15c corresponding to the respective terminal sections 20a, 22a and 22a are respectively provided in these concavities 38. These electrode pads 15a, 15b and 15c are connected to wiring 30 (not shown) as necessary.

Then after respectively providing the electrode pads 15a (15b, 15c) in the concavities 38 in this way, paste form adhesive which is adjustable to liquid form is used as the conductive adhesive 36, and this is selectively discharged and arranged inside the concavities 38 by the liquid droplet discharge method. In this case, it is desirable to more reliably perform selective application of the conductive adhesive 36, by performing lyophilic treatment inside the concavities 38 and liquid repellent treatment of the surroundings of the concavities 38 as illustrated in the eighth embodiment.

Next, the original substrate (not shown) is adhered, and the respective terminal sections 20a, 22a and 22a of the elements 12 are adhered via the conductive adhesive 36 to the corresponding electrode pads 15a (15b, 15c). Then the conductive adhesive 36 is cured by heat treatment or the like.

After curing the conductive adhesive 36 in this way, thereafter the subsequent processes are performed similarly to with the third embodiment In this way, similarly to with the ninth embodiment, the process for conducting the terminal sections 20a, 22a and 22a with the electrode pads 15 by wiring after mounting of the elements 12 can be eliminated, and the processes thus simplified.

Furthermore, since between the terminal sections 20a and 22a (between the electrode pads) it insulated by respectively independently forming the concavities 38, short-circuits between the terminal sections 20a, 22a and 22a by the conductive adhesive 36 can be reliably prevented.

In the abovementioned embodiments, the arrangement is such that the original substrate 10 is the substrate for element forming, however the present invention is not limited to this. For example, the substrate for element forming and the original substrate in the present invention may be separate, and the elements transferred temporarily from the substrate for element forming to the original substrate, after which the elements are again transferred to the final substrate. Furthermore, the transferring from the substrate for element forming to another original substrate may be performed once or several times, after which the elements are transferred to the final substrate via the original substrate of the present invention.

Here, devices obtained by such a manufacturing method, are not specifically limited, and the method is applicable to any device as long as a constituent is an element such as a semiconductor element or an optical element. The method can be applied to various devices, for example, various kinds of semiconductor devices having switching elements such as memories or TFTs, electro-optic devices such as organic electroluminescence devices, liquid crystal displays, electrophoresis apparatus, plasma display units, and also optical devices such as laser equipment.

Examples of electronic equipment of the present invention are those having the abovementioned electro-optic device as a display panel, specifically as shown in FIG. 19.

Figure 19A:
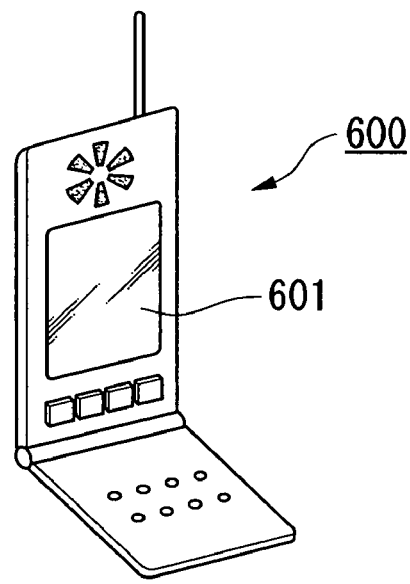
FIG. 19A to 19C are diagrams showing electronic equipment related to the present invention.

FIG. 19A is a perspective view showing an example of a mobile phone. In FIG. 19A, reference numeral 600 denotes the main body of the mobile phone, and 601 denotes a display panel having the abovementioned electro-optic device.

Figure 19B:
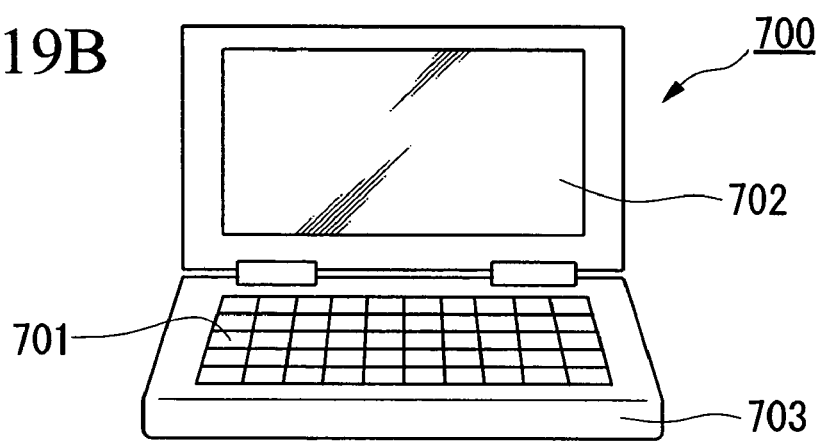

FIG. 19B is a perspective view showing an example of a portable information processor such as word processor or personal computer. In FIG. 19B, reference numeral 700 denotes an information processor, 701 denotes an input section such as keyboard, 703 denotes a main body of the information processor, and 702 denotes a display panel having the above mentioned electro-optic device.

Figure 19C:
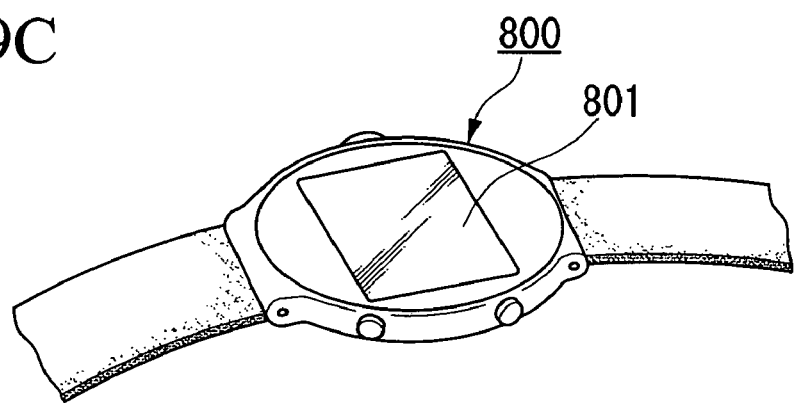

FIG. 19C is a perspective view showing an example of a watch type electronic equipment. In FIG. 19C, reference numeral 800 denotes a main body of the watch and 801 denotes a display panel having the abovementioned electro-optic device.

The electronic equipment shown in FIG. 19A to 19C are furnished with display panels having the abovementioned electro-optic devices, thus giving a high productivity low cost product.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A manufacturing method for a device in which some or all of plural elements formed on an original substrate are transferred to a final substrate, and some or all of the transferred elements are used to manufacture the device, comprising:
   a first process for providing the plural elements on said original substrate via a separation layer in a condition where terminal sections are exposed to a surface on an opposite side to the separation layer;
   a second process for adhering the surface where the terminal sections of said elements to be transferred on the original substrate are exposed, via conductive adhesive, to a surface of the final substrate on a side where conductive sections for conducting with the terminal sections of said elements are provided;
   a third process for producing exfoliation in said separation layer between said original substrate and said final substrate; and
   a fourth process for separating said original substrate from which the transfer of elements has been completed, from said final substrate.

2. The manufacturing method for a device according to claim 1, wherein said original substrate is a substrate for forming elements.

3. The manufacturing method for a device according to claim 1, wherein said conductive adhesive is an anisotropic conductive adhesive.

4. The manufacturing method for a device according to claim 3, wherein in said second process, a film-like anisotropic conductive adhesive is used as said conductive adhesive, and said film-like adhesive is adhered to the surface on the side where the terminal sections of said element are exposed, or to a portion to be connected to said terminal sections on the surface of said final substrate on the side where the conductive sections are provided.

5. The manufacturing method for a device according to claim 1, wherein in said second process, said conductive adhesive is provided between each of the elements and the final substrate in liquid form, and then cured.

6. The manufacturing method for a device according to claim 5, wherein in said second process, said conductive adhesive is selectively arranged by a liquid droplet discharge method.

7. The manufacturing method for a device according to claim 6, wherein prior to selectively arranging said conductive adhesive by the liquid droplet discharge method, each of the elements, or a portion on the final substrate where the conductive adhesive is arranged, is subjected to a lyophilic treatment, and/or the surroundings of the portion of the final substrate where the conductive adhesive is arranged is subjected to a liquid repellent treatment.

8. The manufacturing method for a device according to claim 6, wherein prior to selectively arranging said conductive adhesive by the liquid droplet discharge method, a partition is formed to enclose the conductive section where the conductive adhesive for each of the elements or for the final substrate is arranged, and then, the conductive adhesive is selectively arranged within said partition.

9. The manufacturing method for a device according to claim 6, wherein prior to selectively arranging said conductive adhesive by the liquid droplet discharge method, a concavity is formed in the final substrate at a junction portion of each of the elements with the final substrate, and then the conductive adhesive is selectively arranged in said concavity.

10. The manufacturing method for a device according to claim 9, wherein each of conductive sections for conducting with the terminal sections of the corresponding elements is provided in said concavity before the conductive adhesive is selectively arranged in said concavity.

11. The manufacturing method for a device according to claim 1, wherein in a case where there are plural terminal sections of said elements, the conductive adhesive to be formed on each of the terminal sections is formed in a condition of independence for each of the respective terminal sections, and the conductive adhesives on each of the terminal sections are insulated from each other.

* * * * *